United States Patent
Yamagami

(10) Patent No.: US 11,569,218 B2
(45) Date of Patent: Jan. 31, 2023

(54) SEMICONDUCTOR INTEGRATED CIRCUIT DEVICE

(71) Applicant: SOCIONEXT INC., Kanagawa (JP)

(72) Inventor: Yoshinobu Yamagami, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 443 days.

(21) Appl. No.: 16/929,913

(22) Filed: Jul. 15, 2020

(65) Prior Publication Data

US 2020/0350305 A1   Nov. 5, 2020

Related U.S. Application Data

(63) Continuation of application No. PCT/JP2019/000081, filed on Jan. 7, 2019.

(30) Foreign Application Priority Data

Jan. 19, 2018 (JP) .............................. JP2018-007542

(51) Int. Cl.
*H01L 27/11* (2006.01)
*H01L 27/02* (2006.01)
(Continued)

(52) U.S. Cl.
CPC ...... *H01L 27/0207* (2013.01); *H01L 23/5286* (2013.01); *H01L 27/0928* (2013.01);
(Continued)

(58) Field of Classification Search
CPC ............. H01L 27/0207; H01L 23/5286; H01L 27/0928; H01L 27/1104; H01L 29/0676;
(Continued)

(56) References Cited

U.S. PATENT DOCUMENTS 7,098,478 B2 * 8/2006 Takaura .............. H01L 27/1104
257/302
9,653,563 B2    5/2017 Liaw
(Continued)

FOREIGN PATENT DOCUMENTS

JP    2006-060233 A    3/2006
JP    2008-205168 A    9/2008
(Continued)

OTHER PUBLICATIONS

International Search Report issued in International Patent Application No. PCT/JP2019/000081, dated Mar. 19, 2019; with partial English translation.
(Continued)

*Primary Examiner* — Selim U Ahmed

(74) *Attorney, Agent, or Firm* — McDermott Will & Emery LLP

(57) ABSTRACT

Provided is a layout structure capable of reducing the parasitic capacitance between storage nodes of an SRAM cell using vertical nanowire (VNW) FETs. In the SRAM cell, a first storage node is connected to top electrodes of some transistors, and a second storage node is connected to bottom electrodes of other transistors. Accordingly, the first and second storage nodes have fewer regions adjacent to each other in a single layer.

10 Claims, 17 Drawing Sheets

(51) Int. Cl.
*H01L 23/528* (2006.01)
*H01L 27/092* (2006.01)
*H01L 29/06* (2006.01)
*H01L 29/78* (2006.01)

(52) U.S. Cl.
CPC ...... *H01L 27/1104* (2013.01); *H01L 29/0676* (2013.01); *H01L 29/7827* (2013.01)

(58) Field of Classification Search
CPC ............. H01L 29/7827; H01L 21/8229; H01L 21/823878; H01L 21/823871; H01L 21/823885; H01L 27/092; H01L 27/11; H01L 27/1108; G11C 11/412; G11C 11/4125
See application file for complete search history.

(56) References Cited

U.S. PATENT DOCUMENTS

| | | |
|---|---|---|
| 2006/0038234 A1 | 2/2006 | Liaw |
| 2011/0024828 A1 | 2/2011 | Takeuchi |
| 2011/0249489 A1 | 10/2011 | Bangsaruntip et al. |
| 2015/0303270 A1 | 10/2015 | Liaw |
| 2015/0318289 A1 | 11/2015 | Liaw |
| 2017/0221884 A1* | 8/2017 | Machkaoutsan ............................ H01L 21/823885 |
| 2017/0309632 A1* | 10/2017 | Masuoka ............ H01L 29/1037 |
| 2018/0122793 A1* | 5/2018 | Moroz ................ H01L 29/0676 |

FOREIGN PATENT DOCUMENTS

| | | |
|---|---|---|
| JP | 2013-0528931 A | 7/2013 |
| JP | 2016-146504 A | 8/2016 |
| WO | 2009/128450 A1 | 10/2009 |
| WO | 2017/061139 A1 | 4/2017 |

OTHER PUBLICATIONS

Written Opinion of the International Searching Agency issued in International Patent Application No. PCT/JP2019/000081, dated Mar. 19, 2019; with partial English translation.

* cited by examiner

SEMICONDUCTOR INTEGRATED CIRCUIT DEVICE

CROSS-REFERENCE TO RELATED APPLICATION

This is a continuation of International Patent Application No. PCT/JP2019/000081 filed on Jan. 7, 2019, which claims priority to Japanese Patent Application No. 2018-007542 filed on Jan. 19, 2018, the entire disclosure of which is incorporated by reference herein.

TECHNICAL FIELD

The present disclosure relates to a semiconductor integrated circuit device including vertical nanowire (VNW) field-effect transistors (FETs), particularly to a layout structure of static random-access memory (SRAM) cells.

BACKGROUND ART

In transistors that are basic constituent elements of a large-scale integrated (LSI) circuit, reduction (scaling down) in the gate length has improved the integration, reduced the operation voltage, and increased the operation speed. In recent years, however, an off-current caused by an excessive scaling-down and a resultant significant increase in the power consumption are problematic. In order to solve the problems, transistors with three-dimensional structures in place of typical two-dimensional structures are actively researched. As one of the three-dimensional structures, vertical nanowire FETs (hereinafter referred to as a VNW-FETs as appropriate) are focused on.

Each of U.S. Pat. No. 9,653,563 (FIG. 5) and United States Patent Publication No. 2015/0318289 (FIG. 2A) discloses a layout of SRAM cells using VNW-FETs.

SUMMARY

In the layouts disclosed in U.S. Pat. No. 9,653,563 and United States Patent Publication No. 2015/0318289, two storage nodes of the SRAM cells are adjacent to each other on a single layer. For example, in U.S. Pat. No. 9,653,563, nodes A and B are both located on a bottom electrode layer of the VNW-FETs. In United States Patent Publication No. 2015/0318289, nodes A and B are both located on a top electrode layer of the VNW-FETs.

With miniaturization in semiconductor devices, parasitic capacitances tend to increase. Storage nodes of SRAM cells adjacent to each other on a single layer increase the parasitic capacitance between the storage nodes. In this case, data writing may become difficult and reduce the speed of the memory, or data writing may become rather impossible.

It is an objective of the present disclosure to provide a layout structure capable of reducing a parasitic capacitance between storage nodes of SRAM cells using VNW-FETs.

According to a first aspect of the present disclosure, a semiconductor integrated circuit device includes: a static random-access memory (SRAM) cell including: a first storage node; a second storage node; a first transistor of a first conductivity type, interposed between a higher-voltage power line and the first storage node; a second transistor of a second conductivity type, interposed between a lower-voltage power line and the first storage node; a third transistor of the first conductivity type, interposed between the higher-voltage power line and the second storage node; a fourth transistor of the second conductivity type, interposed between the lower-voltage power line and the second storage node; a fifth transistor of the second conductivity type, interposed between a bit line and the first storage node, the fifth transistor including a gate connected to a word line; and a sixth transistor of the second conductivity type, interposed between an inverted bit line and the second storage node, the sixth transistor including a gate connected to the word line. Gates of the first and second transistors are connected to each other, and to the second storage node. Gates of the third and fourth transistors are connected to each other, and to the first storage node. The first to sixth transistors are vertical nanowire (VNW) FETs. Top electrodes of the first, second, and fifth transistors are connected to the first storage node, and bottom electrodes of the third, fourth, and sixth transistors are connected to the second storage node.

According to this aspect, in the SRAM cell, the first storage node is connected to the top electrodes of the first, second, and fifth transistors, and the second storage node is connected to the bottom electrodes of the third, fourth, and sixth transistors. Accordingly, the first and second storage nodes have, in a single layer, fewer regions adjacent to each other than in the typical configuration. This results in a smaller parasitic capacitance between the storage nodes.

According to a second aspect of the present disclosure, a semiconductor integrated circuit device includes: a static random-access memory (SRAM) cell including: a first storage node; a second storage node; a first transistor of a first conductivity type, interposed between a higher-voltage power line and the first storage node; a second transistor of a second conductivity type, interposed between a lower-voltage power line and the first storage node; a third transistor of the first conductivity type, interposed between the higher-voltage power line and the second storage node; a fourth transistor of the second conductivity type, interposed between the lower-voltage power line and the second storage node; a fifth transistor of the second conductivity type, interposed between a first bit line and the first storage node, the fifth transistor including a gate connected to a first word line; a sixth transistor of the second conductivity type, interposed between a first inverted bit line and the second storage node, the sixth transistor including a gate connected to the first word line; a seventh transistor of the second conductivity type, interposed between a second bit line and the first storage node, the seventh transistor including a gate connected to a second word line; and an eighth transistor of the second conductivity type, interposed between a second inverted bit line and the second storage node, the eighth transistor including a gate connected to the second word line. Gates of the first and second transistors are connected to each other, and to the second storage node. Gates of the third and fourth transistors are connected to each other, and to the first storage node. The first to eighth transistors are vertical nanowire (VNW) FETs. Top electrodes of the first, second, fifth, and seventh transistors are connected to the first storage node. Bottom electrodes of the third, fourth, sixth, and eighth transistors are connected to the second storage node.

According to this aspect, in the SRAM cell, the first storage node is connected to the top electrodes of the first, second, fifth, and seventh transistors, and the second storage node is connected to the bottom electrodes of the third, fourth, sixth, and eighth transistors. Accordingly, the first and second storage nodes have, in a single layer, fewer regions adjacent to each other than in the typical configuration. This results in a smaller parasitic capacitance between the storage nodes.

The present disclosure achieves a layout structure capable of reducing parasitic capacitances between storage nodes of SRAM cells using VNW-FETs.

BRIEF DESCRIPTION OF THE DRAWINGS

FIG. 7A shows a 6T-type, and FIG. 7B shows an 8T-type.

FIG. 14A is a cross-sectional view, and FIG. 14B is a top view.

FIG. 16A is a top view, and FIGS. 16B and 16C are cross-sectional views.

FIG. 17A is a cross-sectional view, and FIG. 17B is a top view.

DETAILED DESCRIPTION

Embodiments will be described in detail with reference to the drawings. In the following embodiments, a semiconductor integrated circuit device includes SRAM cells, which include what is called vertical nanowire FETs (VNW-FETs).

Figure 14A:
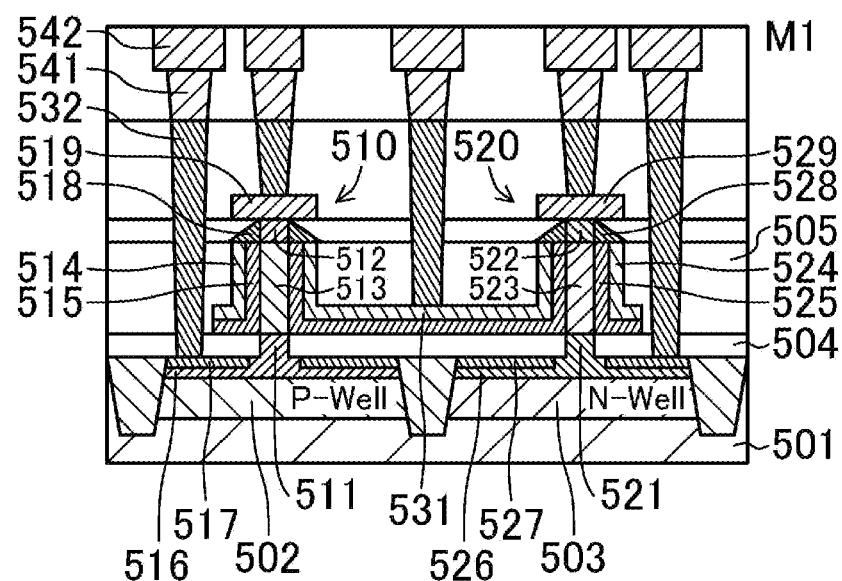
FIGS. 14A and 14B are schematic views showing an example basic structure of a vertical nanowire FET.
Figure 14B:
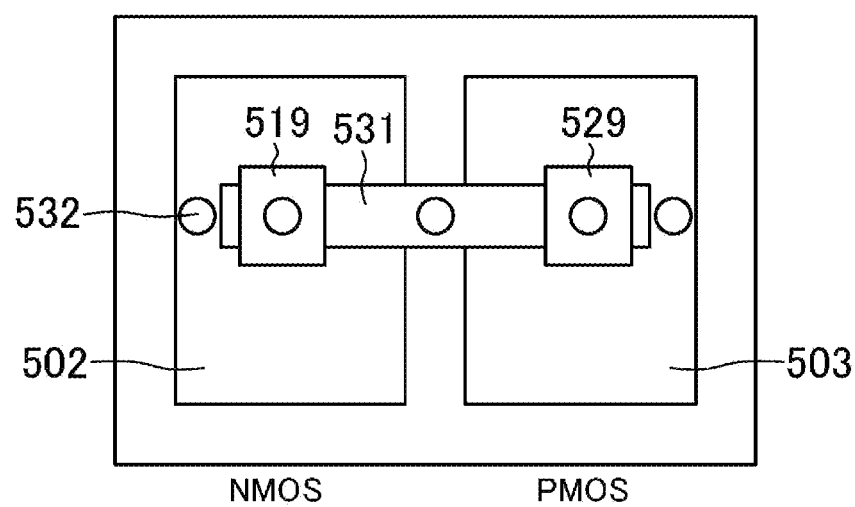

FIGS. 14A and 14B are schematic views each showing an example basic structure of a VNW-FET. FIG. 14A is a cross-sectional view, and FIG. 14B is a top view. In FIG. 14B, metal lines are not shown, and constituent elements that are not seen in an actual top view are shown for easier understanding.

As shown in FIG. 14A, a P-type well 502 and an N-type well 503 are formed on a semiconductor substrate 501. If the semiconductor substrate 501 is a P-type substrate, there is no need to form the P-type well. A VNW-FET 510 that is an N-type transistor is formed on the P-type well 502, and a VNW-FET 520 that is a P-type transistor is formed on the N-type well 503. The reference numeral 504 denotes an insulating film, and the reference numeral 505 denotes an interlayer insulating film.

The VNW-FET 510 includes a bottom electrode 511 serving as a source/drain electrode, atop electrode 512 serving as a source/drain electrode, and a nanowire 513 extending vertically (i.e., in the direction perpendicular to the surface of the substrate) between the bottom electrode 511 and the top electrode 512. The bottom electrode 511 and the top electrode 512 are doped into the N-type. The nanowire 513 at least partially serves as a channel region. The nanowire 513 is surrounded by a gate insulating film 515, which is further surrounded by a gate electrode 514. Note that the gate electrode 514 may surround the whole or only a part of the circumference of the nanowire 513. If the gate electrode 514 surrounds only a part of the circumference of the nanowire 513, the gate insulating film 515 may be formed only in the part in which the gate electrode 514 surrounds the nanowire 513.

The bottom electrode 511 is connected to a bottom region 516 extending along the upper surface of the semiconductor substrate 501. A bottom region 516 has also been n-type doped. A silicide region 517 is formed on the surface of the bottom region 516. In addition, the top electrode 512 is surrounded by a sidewall 518. A silicide region 519 is formed on the top electrode 512. However, the sidewall 518 and the silicide region 519 may not be formed.

Similarly, the VNW-FET 520 includes a bottom electrode 521 serving as a source/drain electrode, a top electrode 522 serving as a source/drain electrode, and a nanowire 523 extending vertically between the bottom electrode 521 and the top electrode 522. The bottom electrode 521 and the top electrode 522 have been p-type doped. The nanowire 523 at least partially serves as a channel region. The nanowire 523 is surrounded by a gate insulating film 525, which is further surrounded by a gate electrode 524.

The bottom electrode 521 is connected to a bottom region 526 extending along the upper surface of the semiconductor substrate 501. The bottom region 526 has also been p-type doped. A silicide region 527 is formed on the surface of the bottom region 526. In addition, the top electrode 522 is surrounded by a sidewall 528. A silicide region 529 is formed on the top electrode 522. However, the sidewall 528 and the silicide region 529 may not be formed.

In the structure of FIGS. 14A and 14B, the gate electrode region 514 of the VNW-FETT 510 and the gate electrode region 524 of the VNW-FET 520 are connected to each other by a gate line 531. In addition, the bottom region 516, the silicide region 519, the gate line 531, the silicide region 529, and the bottom region 526 are connected to a wiring line 542 in a metal wiring layer M1 with a contact 532 and a contact 541. Note that a metal wiring layer may overlie the metal wiring layer M1.

The semiconductor substrate 501 is made of bulk Si, germanium, or a compound or an alloy thereof, for example. Examples of an N-type dopant include As, P, Sb, N, C, and combinations thereof. Examples of a P-type dopant include B, $BF_2$, In, N, C and combinations thereof. The planar shapes of the VNW-FETs 510 and 520 (i.e., the transverse-sectional shapes of the nanowires 513 and 523) may be round, rectangular, or oval, for example.

The material of the insulating film 504 is SiN or SiCN, for example. The material of the interlayer insulating film 505 is SiO, TEOS, PSG, BPSG, FSG, SiOC, SOG, spin-on polymers, SiC, or a mixture thereof, for example. The material of the silicide regions 517 and 527 is NiSi, CoSi, TiSi, or WSi, for example.

The material of the gate electrodes 514 and 524 as well as the gate line 531 is TiN, TaN, TiAl, a Ti-containing metal, a Ta-containing metal, an Al-containing metal, a W-containing metal, TiSi, NiSi, PtSi, polysilicon with silicide, or a combination thereof, for example. The material of the gate insulating films 515 and 525 is SiON, $Si_3N_4$, $Ta_2O_5$, $Al_2O_3$, a Hf oxide, a Ta oxide, or an Al oxide, for example. The material has a k-value of 7 or more in one preferred embodiment.

The material of the silicide regions 519 and 529 located on the top electrodes 512 and 522, respectively, is NiSi, CoSi, MoSi, WSi, PtSi, TiSi, or a combination thereof, for example. As an alternative material may be metal such as W, Cu, or Al, an alloy such as TiN or TaN, an impurity-implanted semiconductor, or a combination thereof. The material of the sidewalls 518 and 528 is SiN, SiON, SiC, SiCN, or SiOCN, for example.

The material of the contact 532 is Ti, TiN, Ta, or TaN, for example. The material may also be Cu, a Cu-alloy, W, Ag, Au, Ni, or Al, for example. Alternatively, the material may be Co or Ru.

Figure 15A:
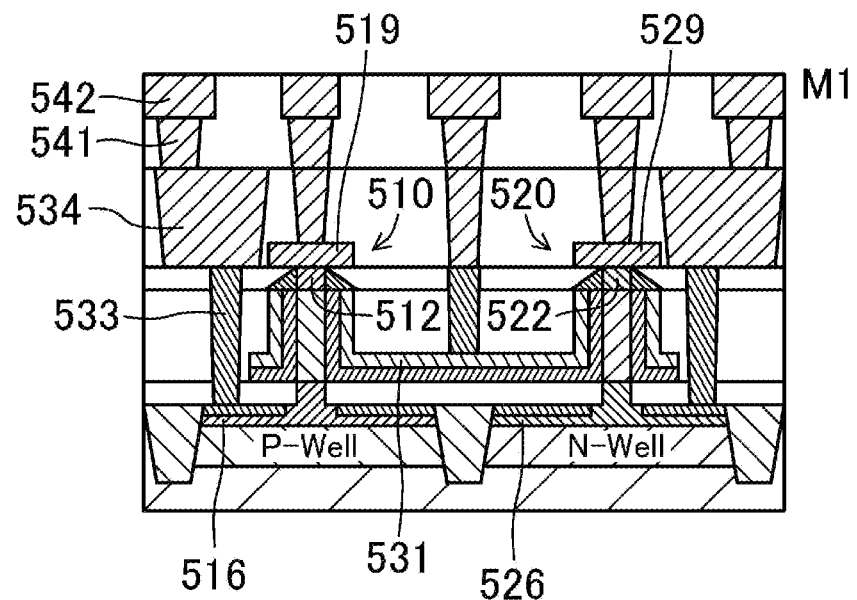
FIGS. 15A and 15B are schematic cross-sectional views showing an example basic structure of a vertical nanowire FET using local interconnects.
Figure 15B:
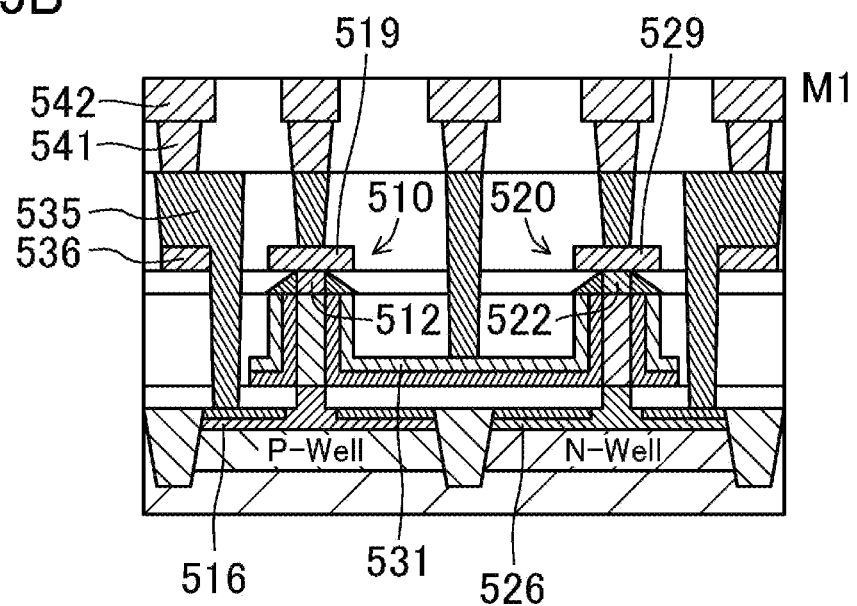

FIGS. 15A and 15B show an example basic structure of a VNW-FET using local interconnects. In FIG. 15A, a local interconnect 534 is interposed between the metal wiring layer M1 and the top electrodes 512 and 522 of the VNW-FETs 510 and 520. The bottom regions 516 and 526 as well as the gate line 531 are connected to the wiring line 542 in the metal wiring layer M1 with the contact 533, the local interconnect 534, and the contact 541. The silicide regions 519 and 529 are connected to the wiring line 542 in the metal wiring layer M1 with the local interconnect 534 and the contact 541.

In FIG. 15B, a local interconnect 535 is interposed between the metal wiring layer M1 and the bottom regions 516 and 526. In other words, the local interconnect 535 corresponds to the integration of the contact 533 and the local interconnect 534 in FIG. 15A. In the formation of the local interconnect 535, a silicide region 536 is used as an etching stopper.

Figure 16C:
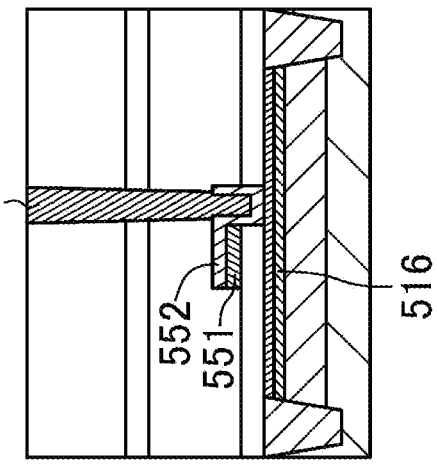
FIGS. 16A to 16C show an example structure connecting gate electrodes and a bottom region in vertical nanowire FETs.
Figure 16A:
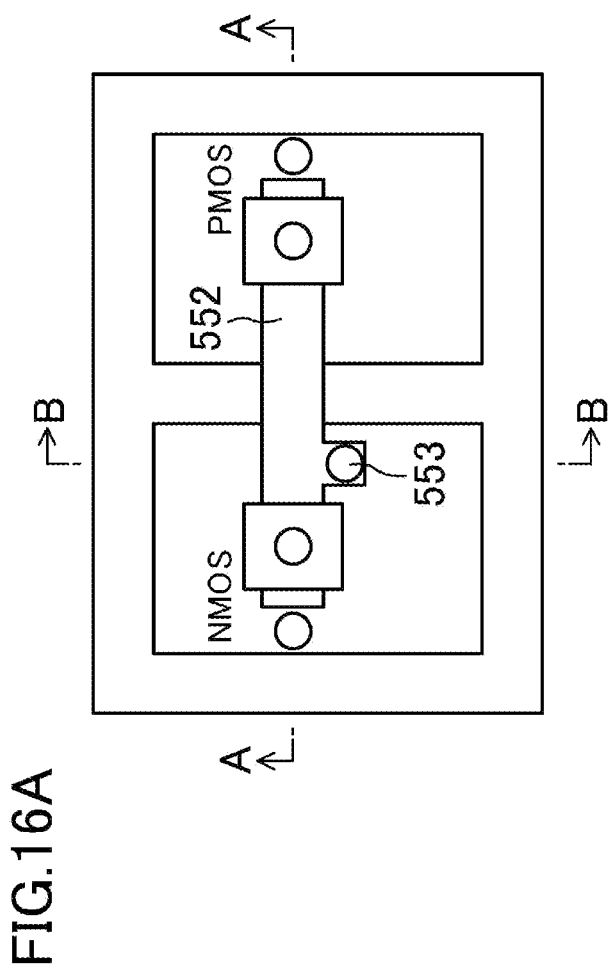
Figure 16B:
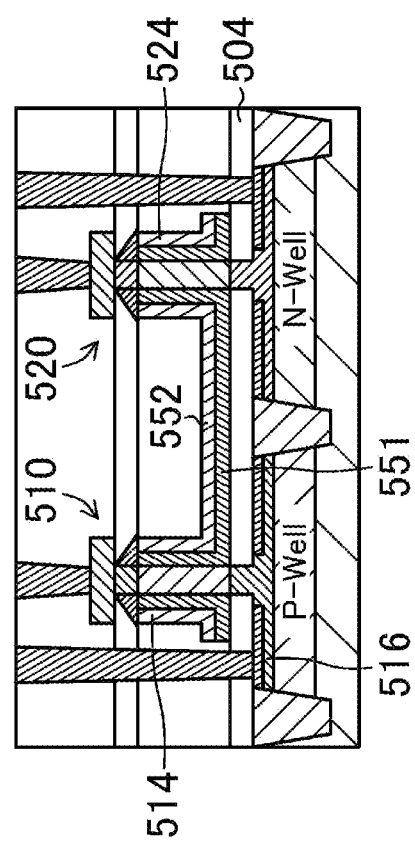

FIGS. 16A to 16C show an example structure connecting gate electrodes and a bottom region in VNW-FETs. FIG. 16A is a top view, FIG. 16B is a cross-sectional view taken along line A-A in FIG. 16A, and FIG. 16C is a cross-sectional view taken along line B-B in FIG. 16A. As shown in FIGS. 16A to 16C, after the formation of a gate insulating film 551 and before the formation of the gate electrodes 514 and 524, a hole penetrating the gate insulating film 551 and the underlying insulating film 504 to reach the bottom region 516 is formed. A film 552 for the gate electrodes, having the hole is formed. Accordingly, the gate electrodes 514 and 524 are connected to the bottom region 516. A contact 553 is formed in the hole.

Figure 17A:
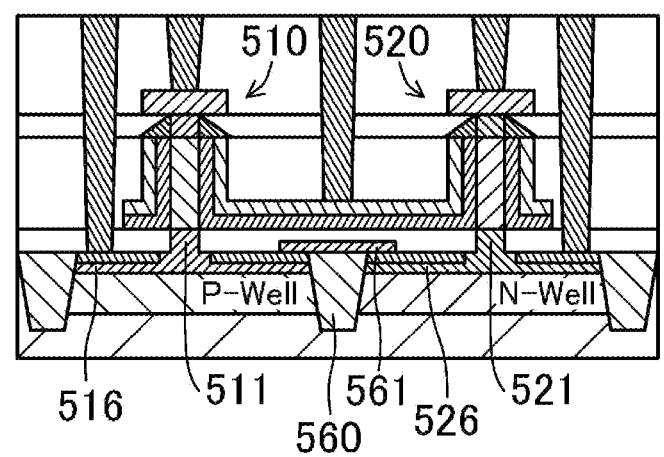
FIGS. 17A and 17B show an example structure connecting bottom regions of different conductive types in vertical nanowire FETs.
Figure 17B:
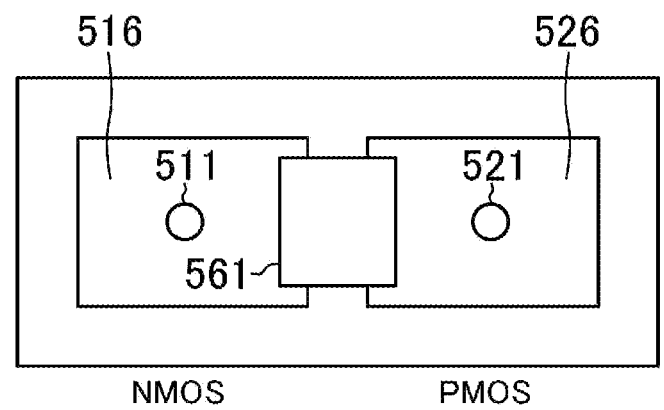

FIGS. 17A and 17B show an example structure connecting bottom regions of different conductivity types in VNW-FETs. FIG. 17A is a cross-sectional view, and FIG. 17B is a top view. As shown in FIG. 17A, an interconnect 561 between bottom regions is formed across a shallow trench isolation (STI) 560 interposed between the bottom regions 516 and 526. The wiring line 561 is made of, for example, a conductive film made of polysilicon or silicided polysilicon, and electrically connects between the bottom regions 516 and 526 together.

In the following description, the bottom, top, and the gate electrodes of each VNW-FET are simply referred to as a "bottom," a "top," and a "gate" as appropriate. Assuming that one or more unit structures, each including a vertical nanowire, a top, a bottom, and a gate, constitute a single VNW-FET, each unit structure is simply referred to as a "VNW" which is distinguished from the VNW-FET. In addition, "VDD" denotes a power supply voltage or a higher-voltage power line, and "VSS" denotes a power supply voltage or a lower-voltage power line.

In the following description, in the top view of FIG. 2, for example, an "X-direction", which corresponds to a "first direction", extends horizontally in the figure, and a "Y-direction", which corresponds to a "second direction", extends vertically in the figure. In the present specification, the expression meaning the same width such as the "same line width" includes the variation range in manufacturing.

First Embodiment

Figure 1:
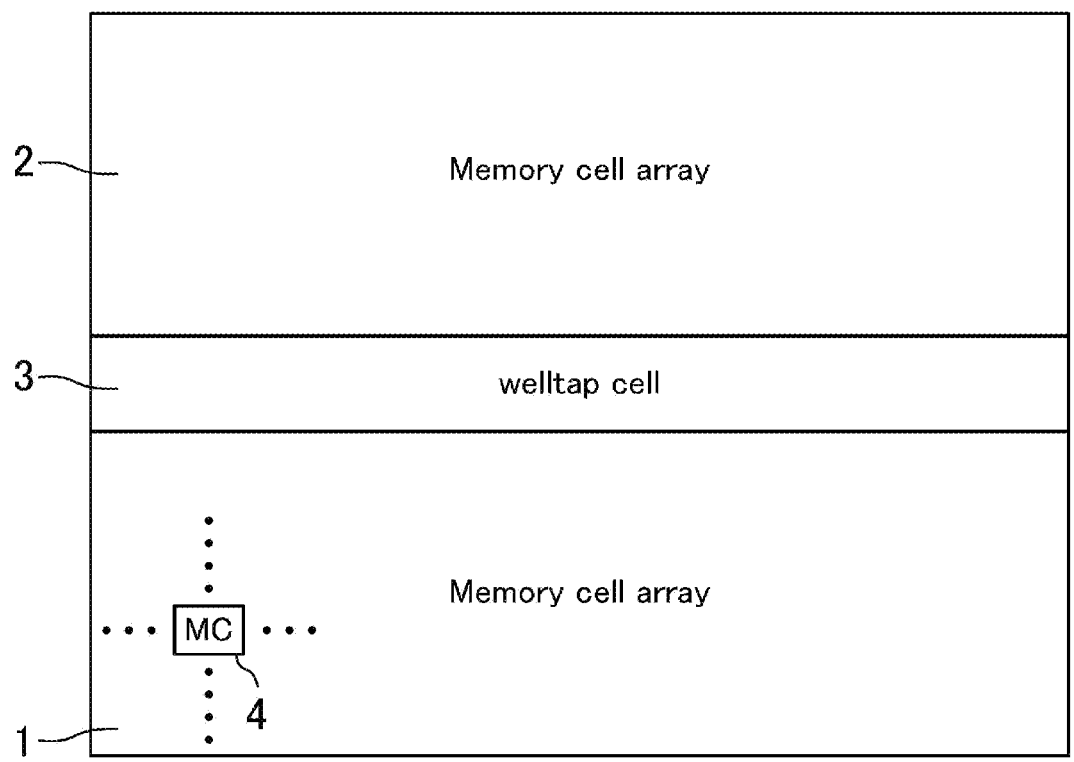
FIG. 1 shows an example overall configuration of a circuit block including SRAM cells using VNW-FETs.

FIG. 1 shows an example overall configuration of a circuit block in a semiconductor integrated circuit device. The circuit block in FIG. 1 includes SRAM cells (hereinafter, simply referred to as "memory cells" as appropriate) using VNW-FETs. Each of memory cell arrays 1 and 2 includes a plurality of memory cells 4 aligned in an array in the X and Y-directions. The memory cell arrays 1 and 2 are aligned in the Y-direction with a tap cell region 3 with a tap cell interposed between them. The tap cell supplies power supply voltages to the substrates or the wells.

Figure 2:
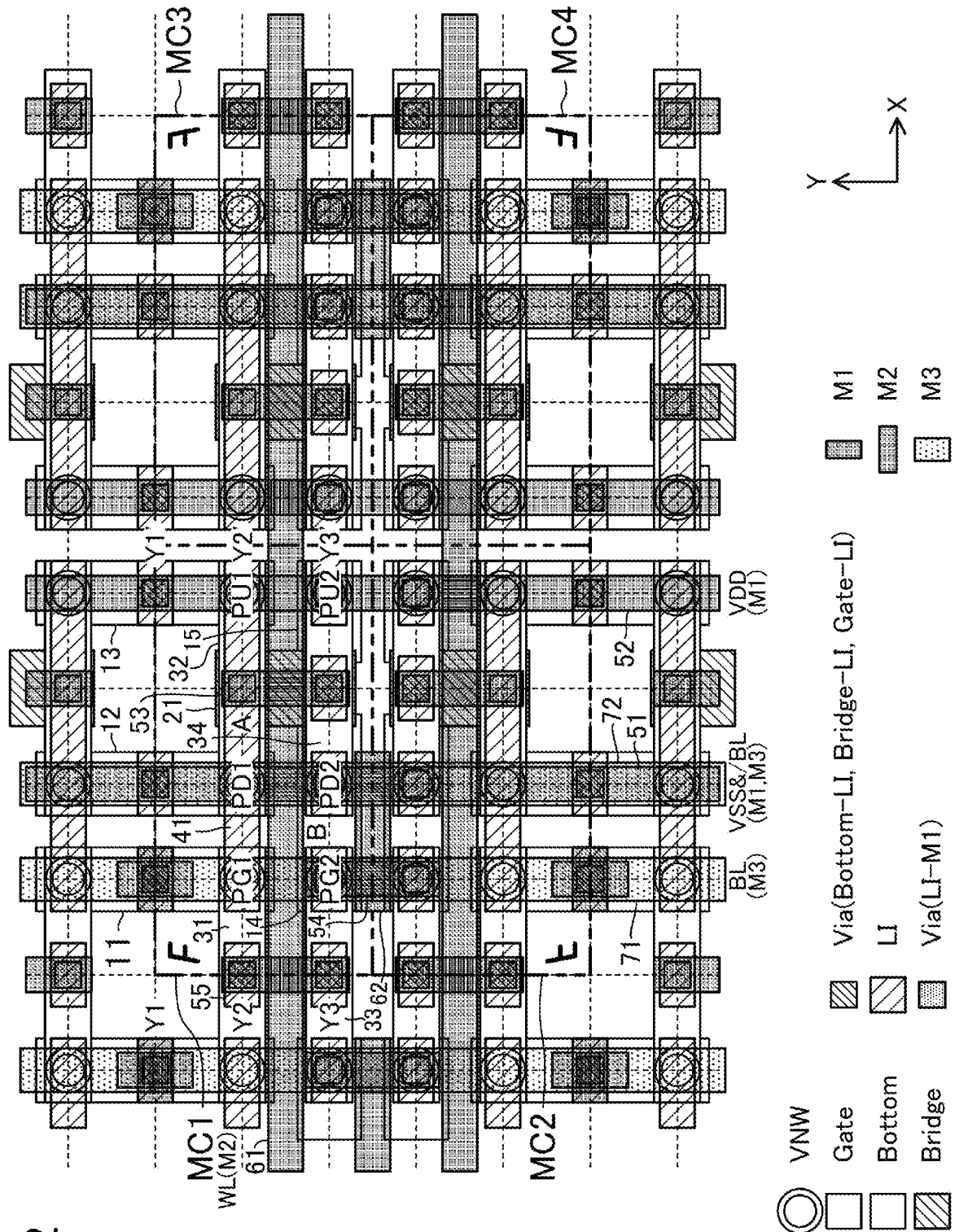
FIG. 2 is a top view showing an example layout structure of SRAM cells according to a first embodiment.
Figure 3:
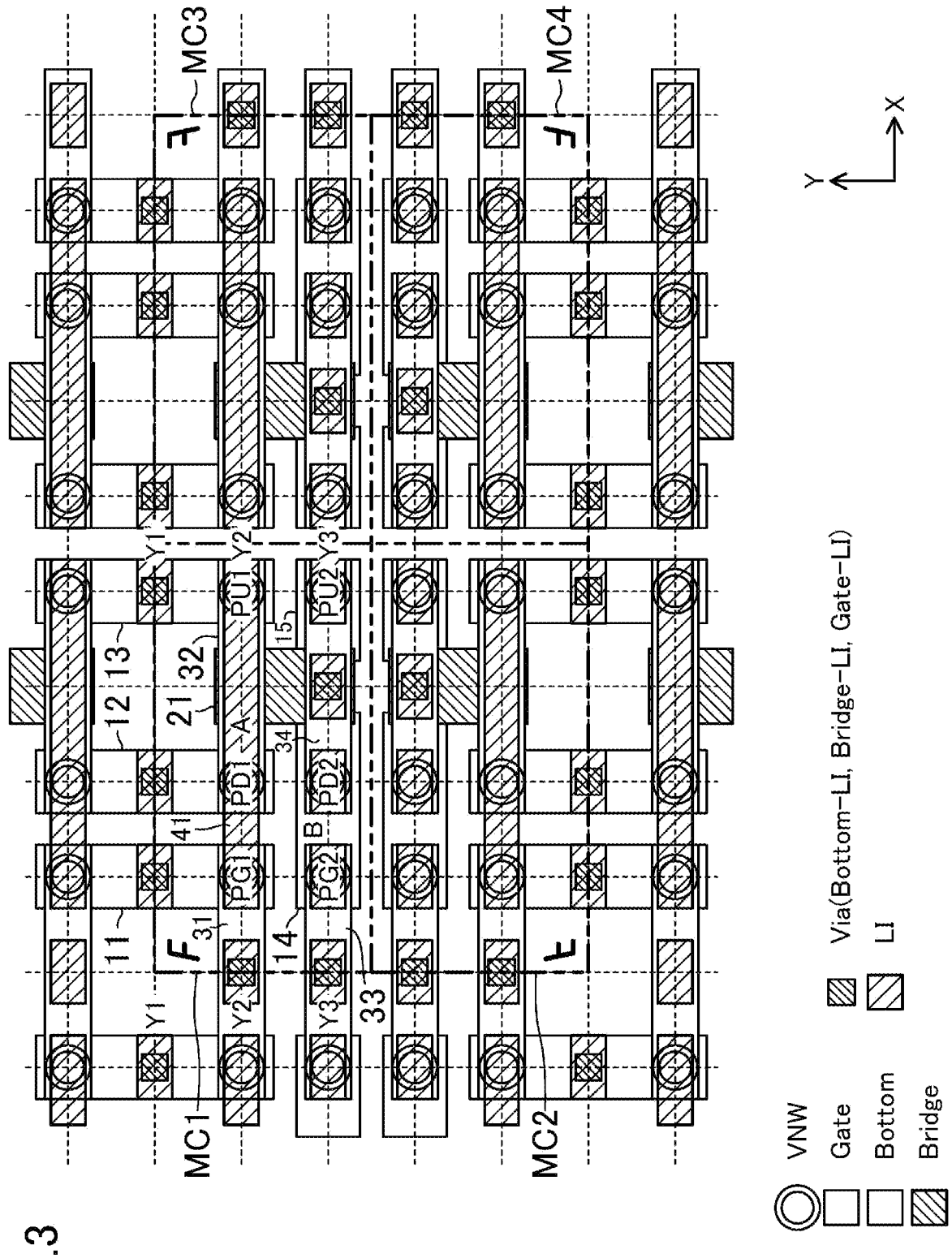
FIG. 3 is a top view of an individual layer in the layout structure of FIG. 2.
Figure 4:
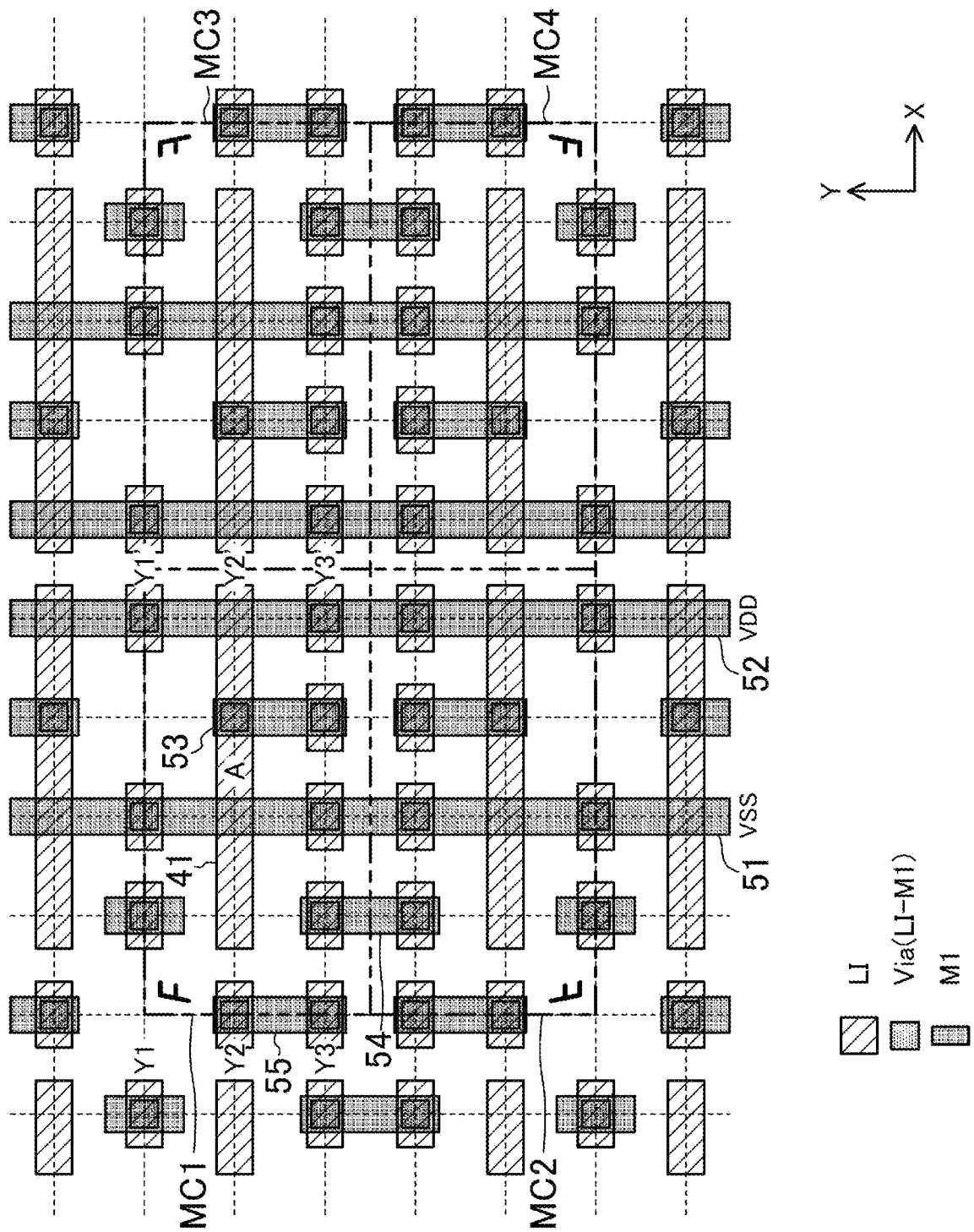
FIG. 4 is a top view of another individual layer in the layout structure of FIG. 2.
Figure 5:
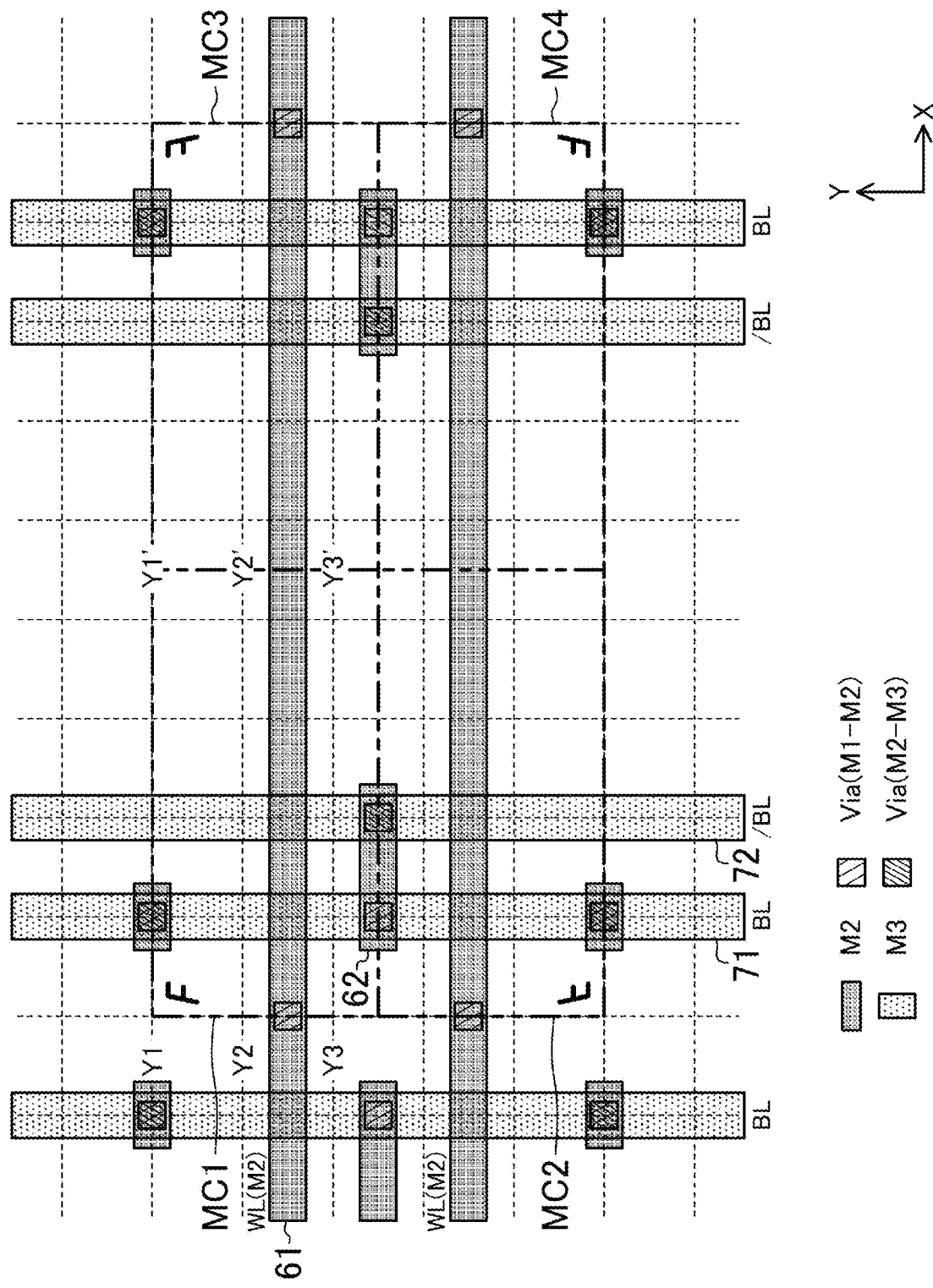
FIG. 5 is a top view of further another individual layer in the layout structure of FIG. 2.

FIGS. 2 to 6 show an example layout structure of the memory cells according to the first embodiment. FIG. 2 is a top view. FIGS. 3 to 5 are top views of individual layers. FIGS. 6A to 6C are cross-sectional views. Specifically, FIG. 3 shows VNW-FETs, underlying layers, and local interconnects. FIG. 4 shows the local interconnects and M1 interconnects. FIG. 5 shows M2 and M3 interconnects. FIGS. 6A to 6C are cross-sectional views as seen horizontally in a top view. FIG. 6A is a cross-sectional view taken along line Y1-Y1', FIG. 6B is a cross-sectional view taken along line Y2-Y2', and FIG. 6C is a cross-sectional view taken along line Y3-Y3'. In FIG. 2, the vias between M1 and M2 and between M2 and M3 are not shown to avoid complication of the figure. The vias between M1 and M2 and between M2 and M3 are shown in FIG. 5.

Figure 6A:
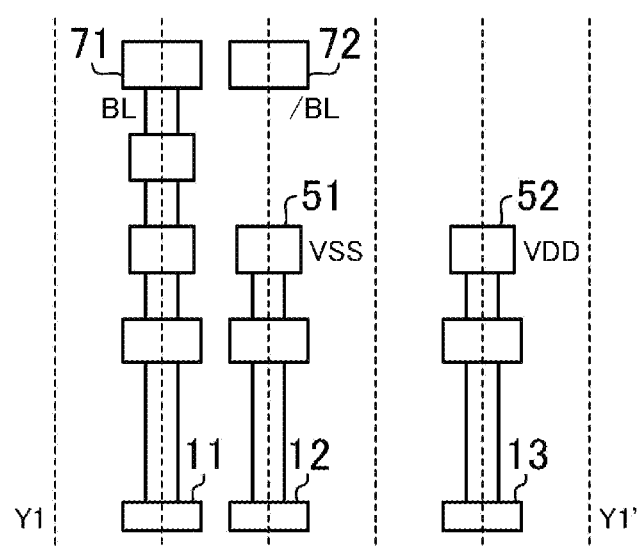
FIGS. 6A to 6C are cross-sectional views showing the layout structure of FIG. 2.
Figure 6B:
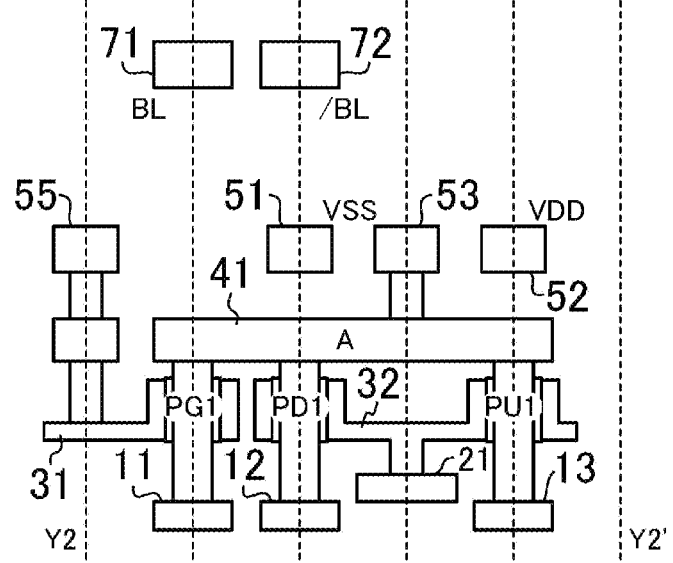
Figure 6C:
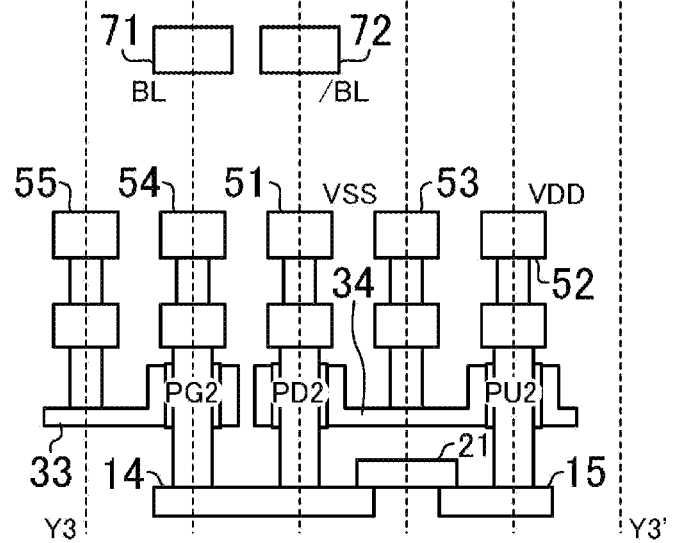
Figure 7A:
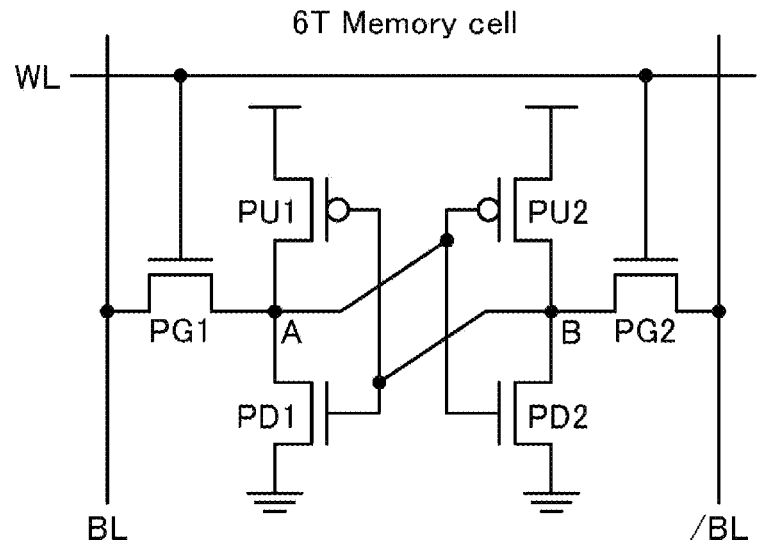
FIGS. 7A and 7B are circuit diagrams of SRAM cells.
Figure 7B:
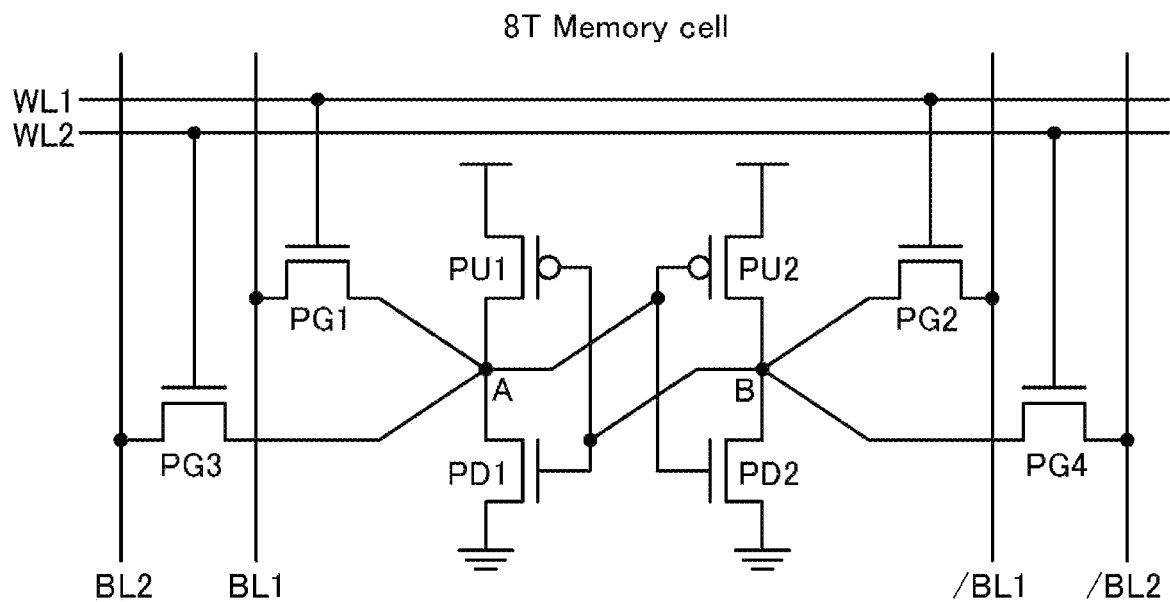

FIG. 7A is a circuit diagram representing the memory cells shown in FIGS. 2 to 6. Each of the memory cells according to this embodiment is a 6T 1-port memory cell shown in FIG. 7A. FIG. 7B is a circuit diagram of an 8T 2-port memory cell according to a second embodiment to be described later.

As shown in FIG. 7A, each of the 6T memory cells according to this embodiment includes transistors PU1, PD1, PU2, PD2, PG1, and PG2. The transistors PU1 and PD1 are connected in series between VDD and VSS. The gates of the transistor PU1 and PD1 are connected to each other. The transistors PU2 and PD2 are connected in series between VDD and VSS. The gates of the transistor PU2 and PD2 are connected to each other. Each of the transistors PG1 and PG2 is an access transistor including a gate connected to a word line WL. The transistors PU1 and PU2 are of the P-type, and the transistors PD1, PD2, PG1, and PG2 are of the N-type. The transistors PU1 and PD1 are connected to each other at a storage node A that is connected to the gates of the transistors PU2 and PD2. The transistors PU2 and PD2 are connected to each other at a storage node B that is connected to the gates of the transistors PU1 and PD1. The transistor PG1 is connected between the storage node A and a bit line BL, and the transistor PG2 is connected between the storage node B and an inverted bit line/BL.

Dotted lines running vertically and horizontally in the top view of FIG. 2, for example, or vertically in the cross-sectional views of FIGS. 6A to 6C, for example, represent grids used for component arrangement at the time of designing. The grids are arranged at equal intervals in the X-direction as well as in the Y-direction. Note that the intervals between the grids in the X-direction may be the same as or different from those in the Y-direction. The intervals between the grids may be different for each layer. For example, the grids for the VNW-FETs and the grids for the M1 interconnect may be arranged at different intervals. In addition, there is no need to arrange the components on the grids. In the view of reducing manufacturing variations, however, the components are arranged on the grids in one preferred embodiment.

The device structure according to this embodiment is assumed to be the structure shown in FIG. 15A. The structure may also be assumed to be the one in FIGS. 14A and 14B and 15B, or any other device structure. The same applies to the subsequent embodiment. For easier understanding of the figure, the wells, the STIs, the insulating films, the silicide layers on the bottoms, the silicide layers on the tops, and the side walls on the tops are not shown. The same applies to the subsequent figures.

FIGS. 2 to 5 show a layout of four adjacent memory cells MC1, MC2, MC3 and MC4 and their surroundings. While only the four memory cells MC1 to MC4 are shown in the figures, other memory cells are arranged above, below, and on the right and left thereof in an actual circuit block. The memory cells MC1 to MC4 have the same structure. The memory cell MC2 has a vertically (i.e., the Y-direction) inverted structure of the memory cell MC1. The memory cell MC3 has a horizontally (i.e., in the X-direction) inverted structure of the memory cell MC1. The memory cell MC4 has a vertically and horizontally inverted structure of the memory cell MC1.

Now, the layout structure will be described in detail using the memory cell MC1 as an example.

The transistors PU1, PU2, PD1, PD2, PG1, and PG2 are VNW-FETs, each including a single VNW. The transistors PG1, PD1, and PU1 are aligned in the X-direction. The transistors PG2, PD2, and PU2 are also aligned in the X-direction. On the other hand, the transistors PG1 and PG2 are aligned in the Y-direction. The transistors PD1 and PD2 are aligned in the Y-direction. The transistors PU1 and PU2 are aligned in the Y-direction. An N-well (not shown) is formed under the P-type transistors PU1 and PU2, and a P-substrate is located or a P-well is formed under the N-type transistors PG1, PG2, PD1, and PD2.

Bottom regions 11, 12, 13, 14, and 15 are formed. The bottom of the transistor PG1 is connected to the bottom region 11. The bottom of the transistor PD1 is connected to the bottom region 12. The bottom of the transistor PU1 is connected to the bottom region 13. The bottom regions 11, 12, and 13 extend in the Y-direction to the memory cell above the memory cell MC1 and are shared between these memory cells. The bottoms of the transistors PG2 and PD2 are connected to the bottom region 14. The bottom of the transistor PU2 is connected to the bottom region 15. The bottom regions 14 and 15 are connected to each other by an interconnect 21 between bottom regions. Note that, in the legend in the figures, each interconnect between bottom regions is represented by a "BRIDGE".

From the gate of the transistor PG1, a gate line 31 is lead out to the left in the X-direction in the figures. The gates of the transistors PD1 and PU1 are connected to each other by a gate line 32 extending in the X-direction. From the gate of the transistor PG2, a gate line 33 is lead out to the left in the X-direction in the figures. The gates of the transistors PD2 and PU2 are connected to each other by a gate line 34 extending in the X-direction. The gate lines 31 and 33 extend in the X-direction to the memory cell on the left of the memory cell MC1 and are shared between these adjacent memory cells.

The interconnect 21 between bottom regions extends to a region overlapping with the gate line 32 in atop view. The interconnect 21 between bottom regions is connected to the gate line 32 with a via. That is, the bottoms of the transistors PG2, PD2, and PU2 are connected to the gates of the transistors PD1 and PU1 with the bottom regions 14 and 15, the interconnect 21 between bottom regions, and the gate line 32. The bottom regions 14 and 15, the interconnect 21 between bottom regions, and the gate line 32 are associated with the storage node B.

The tops of the transistors PG1, PD1, and PU1 are connected to a local interconnect 41 extending in the X-direction. The local interconnect 41 is an example signal interconnect connected to the tops of the transistors PG1, PD1, and PU1. The local interconnect 41 is connected to an M1 interconnect 53 extending in the Y-direction, with a via. The M1 interconnect 53 extends to a region overlapping with the gate line 34 in a top view, and is connected to the gate line 34 with a via and a local interconnect. That is, the tops of the transistors PG1, PD1, and PU1 are connected to the gates of the transistors PD2 and PU2 with the local interconnect 41, the M1 interconnect 53, and the gate line 34. The local interconnect 41, the M1 interconnect 53, and the gate line 34 are associated with the storage node A.

An M1 interconnect 51 that supplies a power supply voltage VSS and an M1 interconnect 52 that supplies a power supply voltage VDD extend in the Y-direction. The M1 interconnect 51 is connected to the bottom region 12 with a via and a local interconnect. That is, the bottom of the transistor PD1 is supplied with the power supply voltage VSS from the M1 interconnect 51 through the bottom region 12. The M1 interconnect 51 is connected to the top of the transistor PD2 with a via and a local interconnect. That is, the top of the transistor PD2 is supplied with the power supply voltage VSS from the M1 interconnect 51. The M1 interconnect 52 is connected to the bottom region 13 with a via and a local interconnect. That is, the bottom of the transistor PU1 is supplied with the power supply voltage VDD from the M1 interconnect 52 through the bottom region 13. The M1 interconnect 52 is connected to the top of the transistor PU2 with a via and a local interconnect. That is, the top of the transistor PU2 is supplied with the power supply voltage VDD from the M1 interconnect 52.

An M2 interconnect 61 that is a word line WL extends in the X-direction. The M2 interconnect 61 is connected to the gate lines 31 and 33 with an M1 interconnect 55 extending in the Y-direction, a local interconnect, and a via. That is, the gates of the transistors PG1 and PG2 are connected to the M2 interconnect 61, that is, the word line WL, with the M1 interconnect 55.

An M3 interconnect 71 that is a bit line BL and an M3 interconnect 72 that is an inverted bit line/BL extend in the Y-direction. The M3 interconnect 71 is connected to the bottom region 11 with an M2 interconnect, an M1 interconnect, a local interconnect, and a via. That is, the bottom of the transistor PG1 is connected to the M3 interconnect 71, that is, the bit line BL, with the bottom region 11. The M3 interconnect 72 is connected to the top of the transistor PG2 with an M2 interconnect 62 extending in the X-direction, the M1 interconnect 54 extending in the Y-direction, a local interconnect, and a via. That is, the top of the transistor PG2 is connected to the M3 interconnect 72, that is, the inverted bit line/BL, with an M1 interconnect 54 and the M2 interconnect 62.

In each SRAM cell according to this embodiment, the storage node A is connected to the tops of the transistors PD1, PU1, and PG1. On the other hand, the storage node B is connected to the bottoms of the transistors PD2, PU2, and PG2. Accordingly, the storage nodes A and B have, in a single layer, fewer regions adjacent to each other than in the typical configuration. This results in a smaller parasitic capacitance between the storage nodes A and B.

Figure 8:
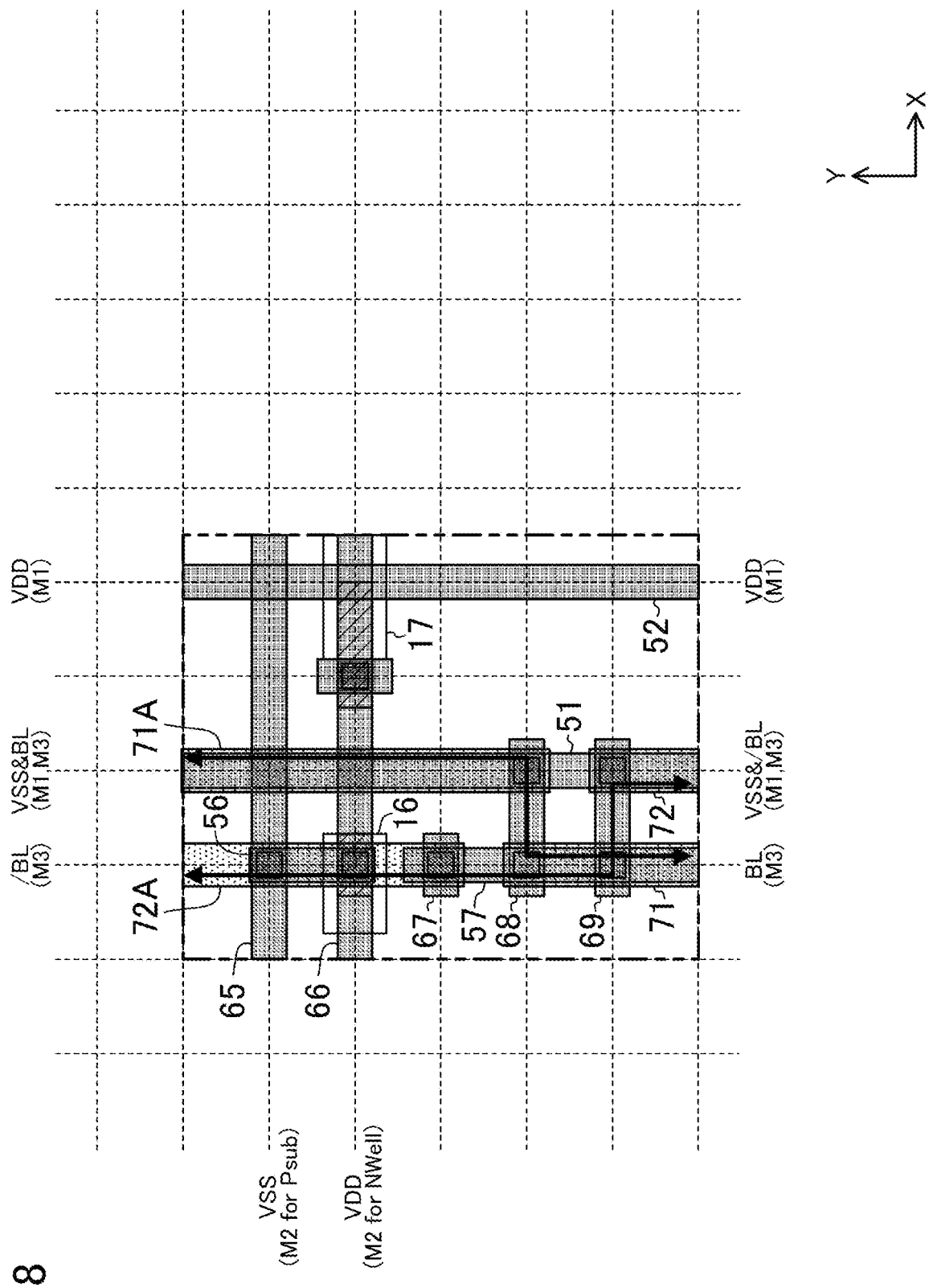
FIG. 8 is a top view showing an example layout structure of a tap cell according to the first embodiment.

FIG. 8 shows an example layout structure of a tap cell according to this embodiment. The tap cell functions to supply a power supply potential to the substrate or the wells. In addition, in this embodiment, the tap cell interchanges the bit line pairs. The SRAM cells in the layout structure described above are located below the tap cell in FIG. 8. Above the tap cell in FIG. 8, SRAM cells are arranged with the bit line BL and the inverted bit line/BL interchanged.

In FIG. 8, an M2 interconnect 65 that supplies a power supply voltage VSS and an M2 interconnect 66 that supplies a power supply voltage VDD extend in the X-direction. The M2 interconnect 65 supplies the power supply voltage VSS through an M1 interconnect 56 and a bottom region 16 to the P-substrate or the P-well. The M2 interconnect 66 supplies the power supply voltage VDD through a bottom region 17 to the N-well. That is, the power supply voltage to the substrate or the wells is supplied separately from the power supply voltage to the memory cells. Note that, for example, the M1 interconnects 51 and 52 may be connected to the M2 interconnects 65 and 66, respectively, to supply the power supply voltages to the substrate or the wells and to the memory cells without being separated from each other.

The M3 interconnect 71 that is the bit line BL is connected to an M3 interconnect 71A with an M2 interconnect 68. The M3 interconnect 72 that is the inverted bit line/BL is connected to an M3 interconnect 72A with an M2 interconnect 69, the M1 interconnect 57, and an M2 interconnect 67. This configuration allows interchange between the bit line pairs above and below the tap cell. Accordingly, the bit line pairs have equal loads throughout the memory block.

In the layout structure described above, the M3 interconnect 71 serving as the bit line BL is located above the transistors PG1 and PG2. The M3 interconnect 72 serving as the inverted bit line/BL is located on the first grid on the right of the M3 interconnect 71, above the M1 interconnect 51 that supplies the power supply voltage VSS. The arrangement of the bit line pairs is however not limited thereto. For example, the M3 interconnect 72 serving as the inverted bit line/BL may be located on the second grid on the right of the M3 interconnect 71. In this case, there is a larger distance between the bit line BL and the inverted bit line/BL, which reduces the capacitance between the bit lines and the influence of crosstalk.

Second Embodiment

Figure 9:
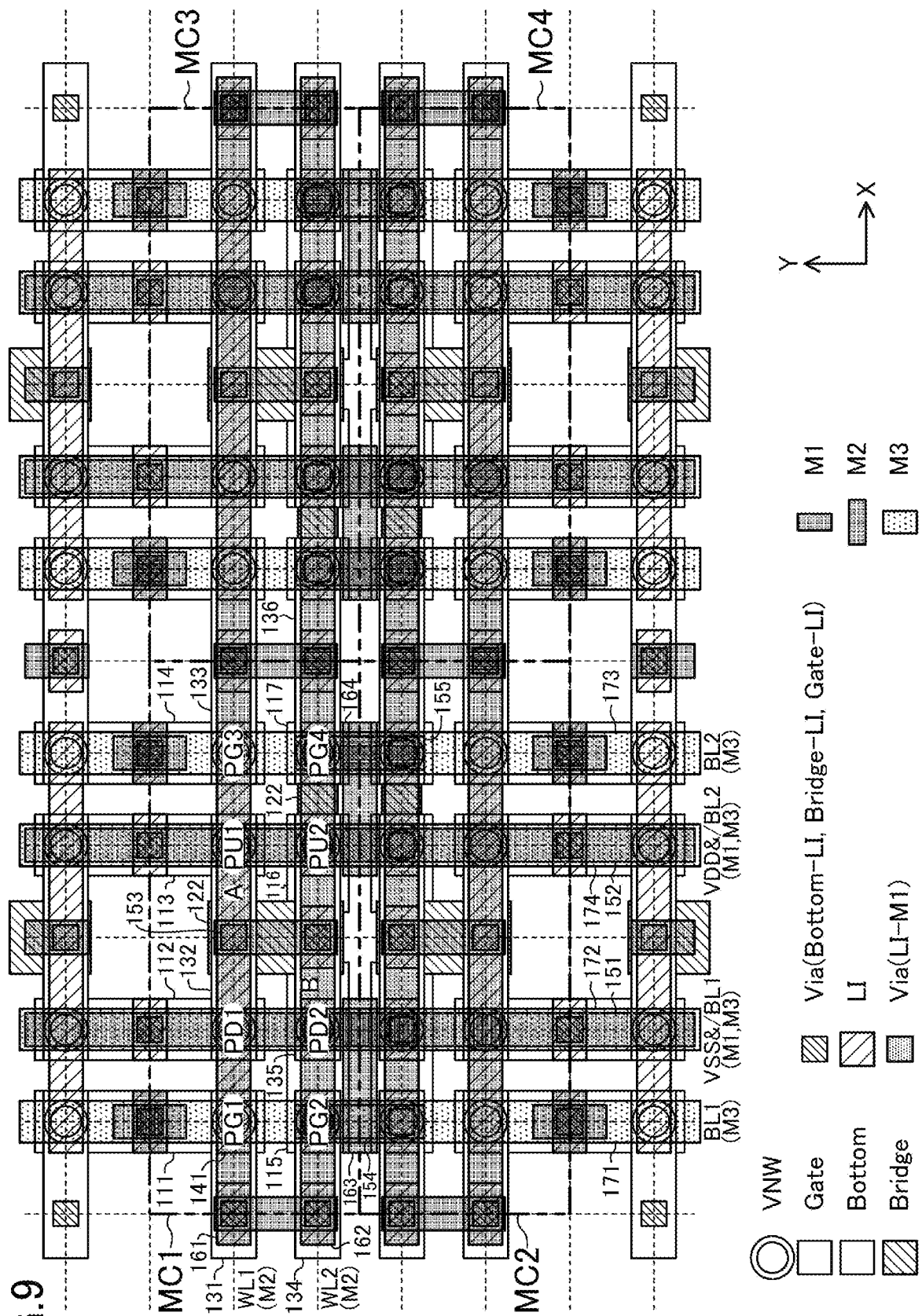
FIG. 9 is a top view showing an example layout structure of SRAM cells according to a second embodiment.
Figure 10:
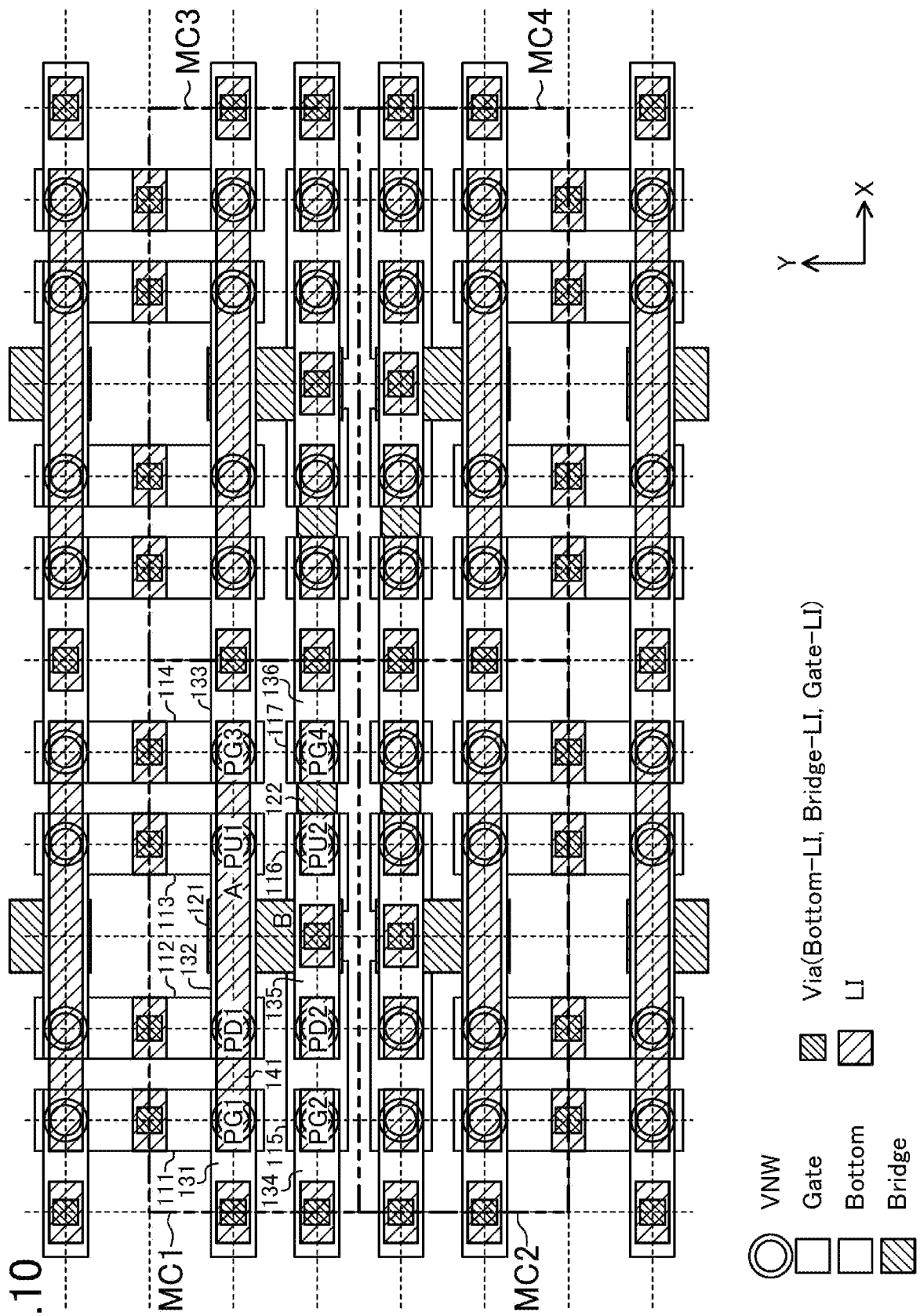
FIG. 10 is a top view of an individual layer in the layout structure of FIG. 9.
Figure 11:
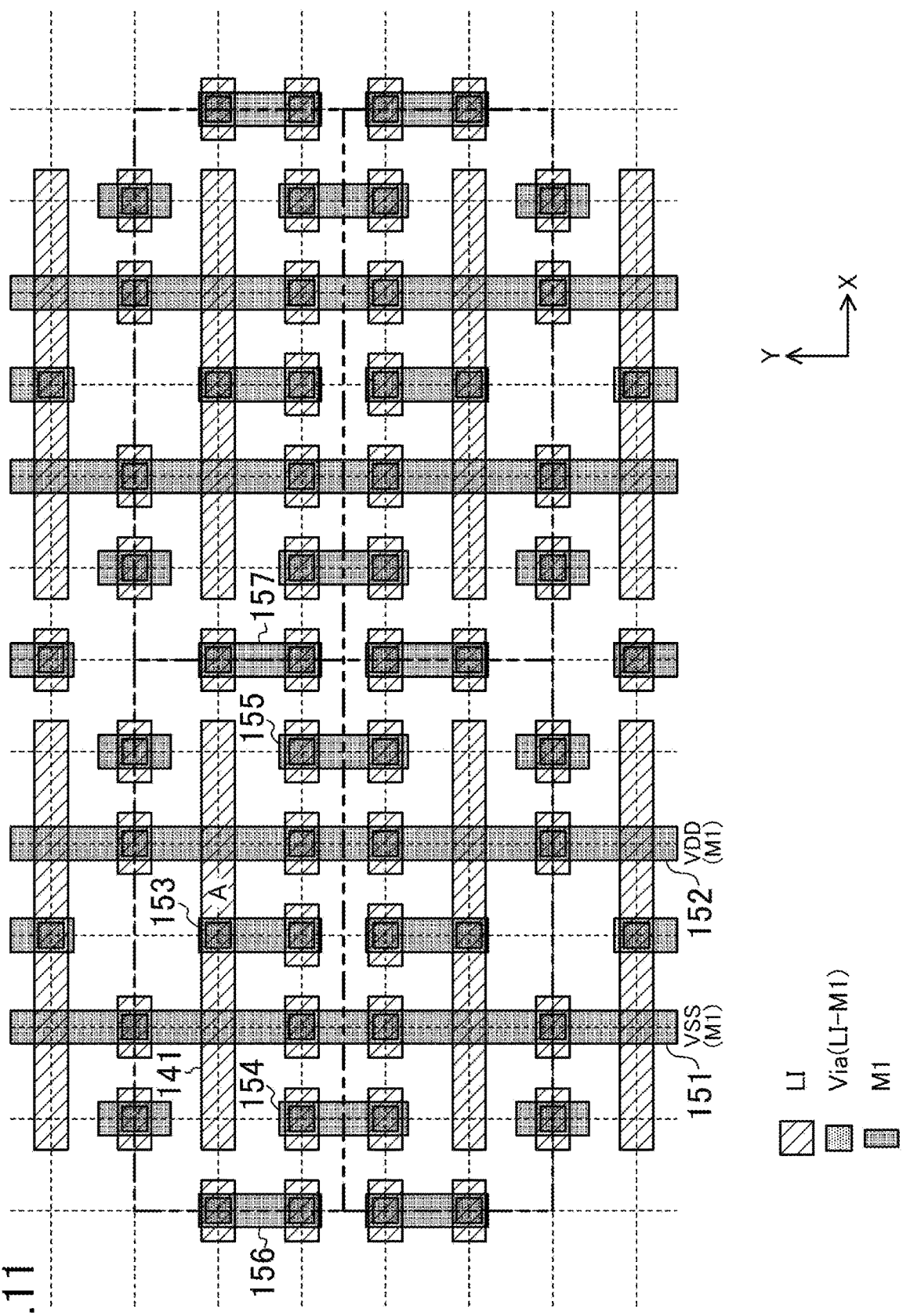
FIG. 11 is a top view of another individual layer in the layout structure of FIG. 9.
Figure 12:
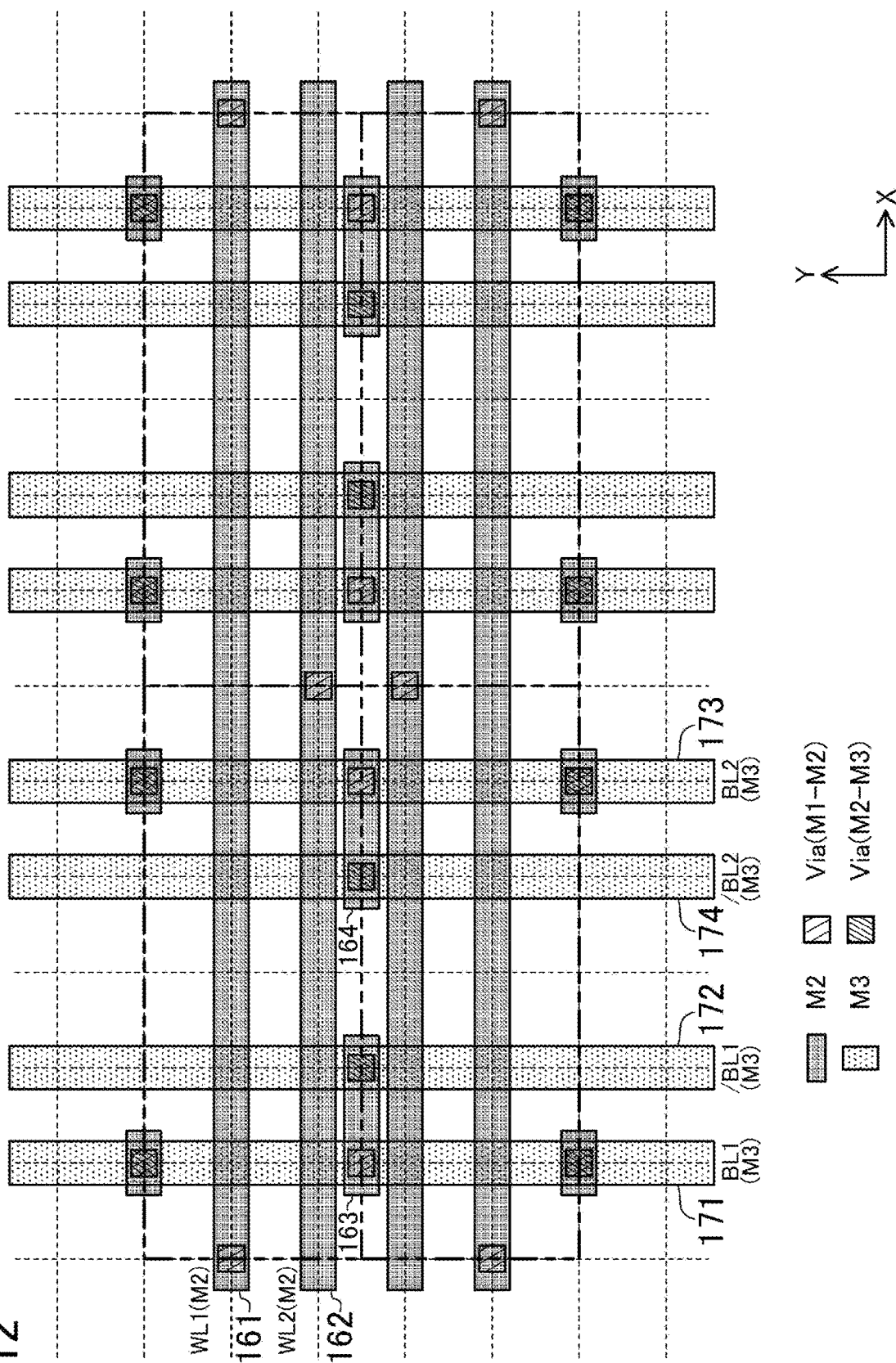
FIG. 12 is a top view of further another individual layer in the layout structure of FIG. 9.

FIGS. 9 to 12 show an example layout structure of memory cells according to a second embodiment. FIG. 9 is a top view. FIGS. 10 to 12 are top views of individual layers. Specifically, FIG. 10 shows VNW-FETs, underlying layers, and local interconnects. FIG. 11 shows the local interconnects and M1 interconnects. FIG. 12 shows M2 and M3 interconnects. In FIG. 9, the vias between M1 and M2 and between M2 and M3 are not shown to avoid complication of the figure. The vias between M1 and M2 and between M2 and M3 are shown in FIG. 12. The cross-sectional structure is the same as in the first embodiment and the cross-sectional view is thus omitted.

FIG. 7B is a circuit diagram representing the memory cells shown in FIGS. 9 to 12. Each of the memory cells according this embodiment is an 8T 2-port memory cell shown in FIG. 7B.

As shown in FIG. 7B, each of the 8T memory cells according to this embodiment includes transistors PU1, PD1, PU2, PD2, PG1, PG2, PG3, and PG4. The transistors PU1 and PD1 are connected in series between VDD and VSS. The gates of the transistor PU1 and PD1 are connected to each other. The transistors PU2 and PD2 are connected in series between VDD and VSS. The gates of the transistor PU2 and PD2 are connected to each other. Each of the transistors PG1 and PG2 is an access transistor including a gate connected to a first word line WL1. Each of the transistors PG3 and PG4 is an access transistor including a gate connected to a second word line WL2. The transistors PU1 and PU2 are of the P-type, and the transistors PD1, PD2, PG1, PG2, PG3, and PG4 are of the N-type. The transistors PU1 and PD1 are connected to each other at a storage node A that is connected to the gates of the transistors PU2 and PD2. The transistors PU2 and PD2 are connected to each other at a storage node B that is connected to the gates of the transistors PU1 and PD1. The transistor PG is connected between the storage node A and a first bit line BL1, and the transistor PG2 is connected between the storage node B and a first inverted bit line/BL1. The transistor PG3 is connected between the storage node A and a second bit line BL2, and the transistor PG4 is connected between the storage node B and a second inverted bit line/BL2.

FIGS. 9 to 12 show a layout of four adjacent memory cells MC1, MC2, MC3 and MC4 and their surroundings. While only the four memory cells MC1 to MC4 are shown in the figures, other memory cells are arranged above, below, and on the right and left thereof in an actual circuit block. The memory cells MC1 to MC4 have the same structure. The memory cell MC2 has a vertically (i.e., the Y-direction) inverted structure of the memory cell MC1. The memory cell MC3 has a horizontally (i.e., in the X-direction) inverted structure of the memory cell MC1. The memory cell MC4 has a vertically and horizontally inverted structure of the memory cell MC1.

Now, the layout structure will be described in detail using the memory cell MC1 as an example.

The transistors PU1, PU2, PD1, PD2, PG1, PG2, PG3, and PG4 are VNW-FETs, each including a single VNW. The transistors PG1, PD1, PU1, and PG3 are aligned in the X-direction. The transistors PG2, PD2, PU2, and PG4 are also aligned in the X-direction. On the other hand, the transistors PG1 and PG2 are aligned in the Y-direction. The transistors PD1 and PD2 are aligned in the Y-direction. The transistors PU1 and PU2 are aligned in the Y-direction. The transistors PG3 and PG4 are aligned in the Y-direction. An N-well (not shown) is formed under the P-type transistors PU1 and PU2, and a P-substrate is located or a P-well is formed under the N-type transistors PG1, PG2, PD1, PD2, PG3, and PG4.

Bottom regions 111, 112, 113, 114, 115, 116, and 117 are formed. The bottom of the transistor PG1 is connected to the bottom region 111. The bottom of the transistor PD1 is connected to the bottom region 112. The bottom of the transistor PU1 is connected to the bottom region 113. The bottom of the transistor PG3 is connected to the bottom region 114. The bottom regions 111, 112, 113, and 114 extend in the Y-direction to the memory cell above the memory cell MC1 and are shared between these memory cells. The bottoms of the transistors PG2 and PD2 are connected to the bottom region 115. The bottom of the transistor PU2 is connected to the bottom region 116. The bottom of the transistor PG4 is connected to the bottom region 117. The bottom regions 115 and 116 are connected to each other by an interconnect 121 between bottom regions. The bottom regions 116 and 117 are connected to each other by an interconnect 122 between bottom regions.

From the gate of the transistor PG1, a gate line 131 is lead out to the left in the X-direction in the figures. The gates of the transistors PD1 and PU1 are connected to each other by a gate line 132 extending in the X-direction. From the gate of the transistor PG3, a gate line 133 is lead out to the right in the X-direction in the figures. From the gate of the transistor PG2, a gate line 134 is lead out to the left in the X-direction in the figures. The gates of the transistors PD2 and PU2 are connected to each other by a gate line 135 extending in the X-direction. From the gate of the transistor PG4, a gate line 136 is lead out to the right in the X-direction in the figures. The gate lines 131 and 134 extend in the X-direction to the memory cell on the left of the memory cell MC1 and are shared between these adjacent memory cells. The gate lines 133 and 136 extend in the X-direction to the memory cell MC3 on the right of the memory cell MC1 and are shared between the memory cells MC1 and MC3.

The interconnect 121 between bottom regions extends to a region overlapping with the gate line 132 in a top view. The interconnect 121 between bottom regions is connected to the gate line 132 with a via. That is, the bottoms of the transistors PG2, PD2, PU2, and PG4 are connected to the gates of the transistors PD1 and PUT with the bottom regions 115, 116, and 117, the interconnects 121 and 122 between bottom regions, and the gate line 132. The bottom regions 115, 116, and 117, the interconnects 121 and 122 between bottom regions, and the gate line 132 are associated with the storage node B.

The tops of the transistors PG1, PD1, PU1, and PG3 are connected to a local interconnect 141 extending in the X-direction. The local interconnect 141 is an example signal line connected to the tops of the transistors PG1, PD1, PU1, and PG3. The local interconnect 141 is connected to an M1 interconnect 153 extending in the Y-direction, with a via. The M1 interconnect 153 extends to a region overlapping with the gate line 135 in a top view, and is connected to the gate line 135 with a via and a local interconnect. That is, the tops of the transistors PG1, PD1, PU1, and PG3 are connected to the gates of the transistors PD2 and PU2 with the local interconnect 141, the M1 interconnect 153, and the gate line 135. The local interconnect 141, the M1 interconnect 153, and the gate line 135 are associated with the storage node A.

An M1 interconnect 151 that supplies a power supply voltage VSS and an M1 interconnect 152 that supplies a power supply voltage VDD extend in the Y-direction. The M1 interconnect 151 is connected to the bottom region 112 with a via and a local interconnect. That is, the bottom of the transistor PD1 is supplied with the power supply voltage VSS from the M1 interconnect 151 through the bottom region 112. The M1 interconnect 151 is connected to the top of the transistor PD2 with a via and a local interconnect. That is, the top of the transistor PD2 is supplied with the power supply voltage VSS from the M1 interconnect 151. The M1 interconnect 152 is connected to the bottom region 113 with a via and a local interconnect. That is, the bottom of the transistor PU1 is supplied with the power supply voltage VDD from the M1 interconnect 152 through the bottom region 113. The M1 interconnect 152 is connected to the top of the transistor PU2 with a via and a local interconnect. That is, the top of the transistor PU2 is supplied with the power supply voltage VDD from the M1 interconnect 152.

An M2 interconnect 161 that is a first word line WL1 and an M2 interconnect 162 that is a second word line WL2 extend in the X-direction. The M2 interconnect 161 is connected to the gate lines 131 and 134 with an M1 interconnect 156 extending in the Y-direction, a local interconnect, and a via. That is, the gates of the transistors PG1 and PG2 are connected to the M2 interconnect 161, that is, the first word line WL1, with the M1 interconnect 156. The M2 interconnect 162 is connected to the gate lines 133 and 136 with an M1 interconnect 157 extending in the Y-direction, a local interconnect, and a via. That is, the gates of the transistors PG3 and PG4 are connected to the M2 interconnect 162, that is, the second word line WL2, with the M1 interconnect 157.

An M3 interconnect 171 that is a first bit line BL1, an M3 interconnect 172 that is a first inverted bit line/BL1, an M3 interconnect 173 that is a second bit line BL2, and an M3 interconnect 174 that is a second inverted bit line/BL2 extend in the Y-direction. The M3 interconnect 171 is connected to the bottom region 111 with an M2 interconnect, an M1 interconnect, a local interconnect, and a via. That is, the bottom of the transistor PG1 is connected to the M3 interconnect 171, that is, the first bit line BL1, with the bottom region 111. The M3 interconnect 172 is connected to the top of the transistor PG2 with an M2 interconnect 163 extending in the X-direction, an M1 interconnect 154 extending in the Y-direction, a local interconnect, and a via. That is, the top of the transistor PG2 is connected to the M3 interconnect 172 that is, the first inverted bit line/BL1, with the M1 interconnect 154 and the M2 interconnect 163. The M3 interconnect 173 is connected to the bottom region 114 with an M2 interconnect, an M1 interconnect, a local interconnect, and a via. That is, the bottom of the transistor PG3 is connected to the M3 interconnect 173, that is, the second bit line BL2, with the bottom region 114. The M3 interconnect 174 is connected to the top of the transistor PG4 with an M2 interconnect 164 extending in the X-direction, an M1 interconnect 155 extending in the Y-direction, a local interconnect, and a via. That is, the top of the transistor PG4 is connected to the M3 interconnect 174, that is, the second inverted bit line/BL2, with the M1 interconnect 155 and the M2 interconnect 164.

In each SRAM cell according to this embodiment, the storage node A is connected to the tops of the transistors PD1, PU1, PG1, and PG3. On the other hand, the storage node B is connected to the bottoms of the transistors PD2, PU2, PG2, and PG4. Accordingly, the storage nodes A and B have, in a single layer, fewer regions adjacent to each other than in the typical configuration. This results in a smaller parasitic capacitance between the storage nodes A and B.

Figure 13:
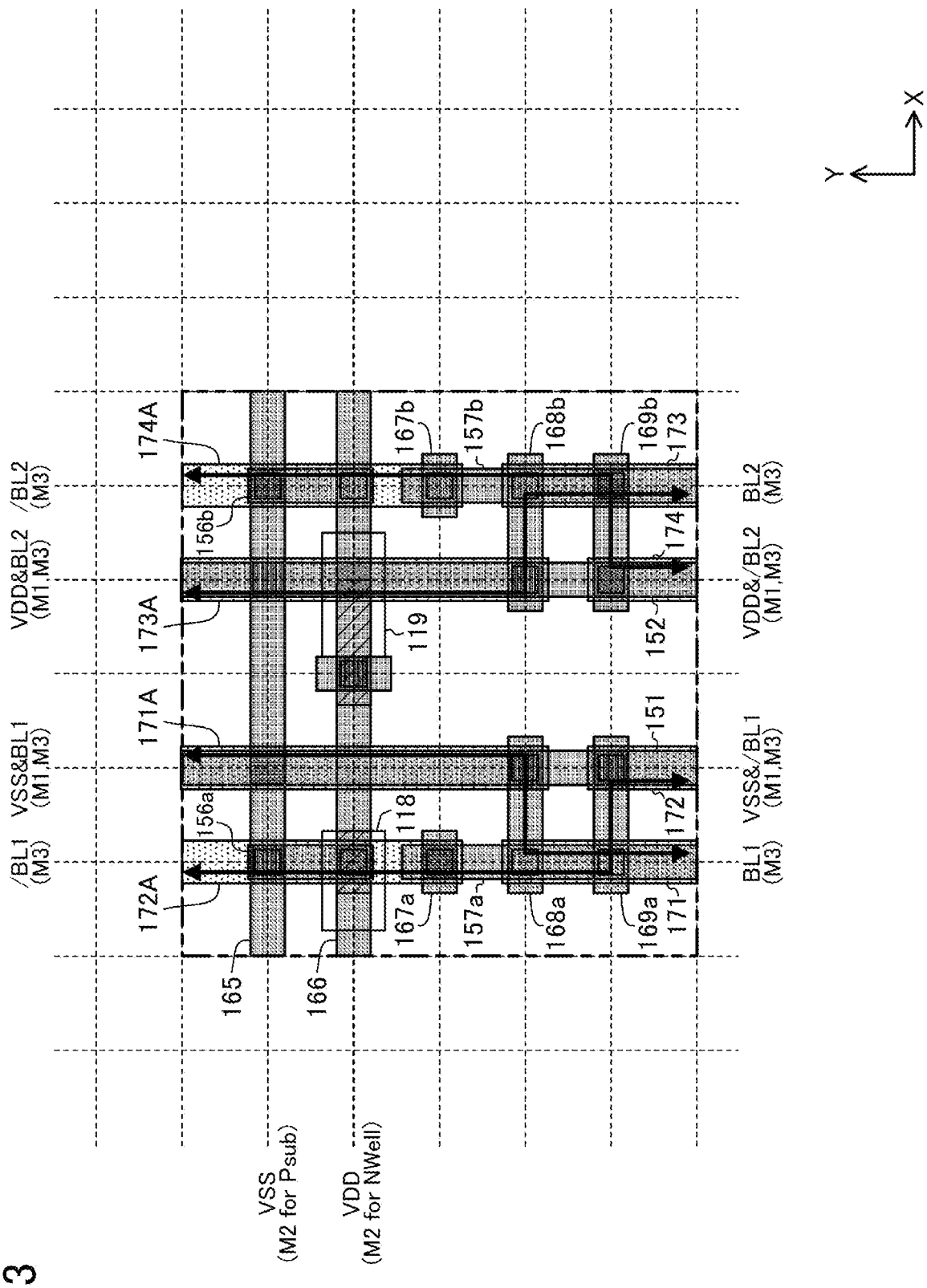
FIG. 13 is a top view showing an example layout structure of a tap cell according to the second embodiment.

FIG. 13 shows an example layout structure of a tap cell according to this embodiment. As described in the first embodiment, the tap cell functions to supply a power supply potential to the substrate or the wells. In addition, in this embodiment, the tap cell interchanges the bit line pairs as in the first embodiment. The SRAM cells in the layout structure described above are located below the tap cell in FIG. 13. Above the tap cell in FIG. 13, SRAM cells are arranged with the first bit line BL1 and the first inverted bit line/BL1 interchanged and the second bit line BL2 and the second inverted bit line/BL2 interchanged.

In FIG. 13, an M2 interconnect 165 that supplies a power supply voltage VSS and an M2 interconnect 166 that supplies a power supply voltage VDD extend in the X-direction. The M2 interconnect 165 supplies the power supply voltage VSS through an M1 interconnect 156a and a bottom region 118 to the P-substrate or the P-well. The M2 interconnect 166 supplies the power supply voltage VDD through the bottom region 119 to the N-well. That is, the power supply voltage to the substrate or the wells is supplied separately from the power supply voltage to the memory cells. Note that, for example, the M1 interconnects 151 and 152 may be connected to the M2 interconnects 165 and 166, respectively, to supply the power supply voltages to the substrate or the wells and to the memory cells without being separated from each other.

The M3 interconnect 171 that is the first bit line BL1 is connected to an M3 interconnect 171A with an M2 interconnect 168a. The M3 interconnect 172 that is the first inverted bit line/BL1 is connected to an M3 interconnect 172A with an M2 interconnect 169a, an M1 interconnect 157a, and an M2 interconnect 167a. The M3 interconnect 173 that is the second bit line BL2 is connected to an M3 interconnect 173A with an M2 interconnect 168b. The M3 interconnect 174 that is the second inverted bit line/BL2 is connected to an M3 interconnect 174A with an M2 interconnect 169b, an M1 interconnect 157b, and an M2 interconnect 167b. This configuration allows interchange between the bit line pairs above and below the tap cell. Accordingly, the bit line pairs have equal loads throughout the memory block.

Other Embodiments (1)

While each VNW has a circular planar shape in the example layout structures described above, the planar shape of each VNW is not limited to a circle. For example, the shape may be a rectangle, an oval, or any other shape. For example, a VNW in an oval shape has a larger area per unit area, which allows a larger amount of current to flow to the transistor and achievement of a higher speed of a semiconductor integrated circuit device.

Planar shapes of VNWs each extending in one direction like an oval extend in the same direction in one preferred embodiment. In addition, the ends are shapes are aligned in one preferred embodiment.

Each SRAM cell does not necessarily include the VNWs all in the same shape and may include a mixture of VNWs in different planar shapes. For example, circular VNWs and oval VNWs may be mixed.

Each transistor includes a single VNW in the embodiment described above, but each transistor may include a plurality of VNWs.

(2)

In the embodiments described above, the tap cell interchanges the bit line pairs. Instead, a configuration that interchanges the bit line pairs may be included in the circuit block separately from the tap cell.

For example, if the difference in the load between a bit line pair falls within an allowable range, the bit line pair may not be interchanged.

(3)

In the above-described embodiments, the power lines may be arranged in the empty grids in the M2 and M3 interconnect layers. In this case, the connections between the arranged power lines and the power lines in the overlying and underlying wiring line layers reinforce the power supply.

According to the present disclosure, the parasitic capacitance can be decreased between the storage nodes of the SRAM cells using VNW-FETs. The present disclosure is useful for improving the performance of a semiconductor chip, for example.

What is claimed is:

1. A semiconductor integrated circuit device comprising:
    a static random-access memory (SRAM) cell including:
        a first storage node;
        a second storage node;
        a first transistor of a first conductivity type, interposed between a higher-voltage power line and the first storage node;
        a second transistor of a second conductivity type, interposed between a lower-voltage power line and the first storage node;
        a third transistor of the first conductivity type, interposed between the higher-voltage power line and the second storage node;
        a fourth transistor of the second conductivity type, interposed between the lower-voltage power line and the second storage node;
        a fifth transistor of the second conductivity type, interposed between a bit line and the first storage node, the fifth transistor including a gate connected to a word line; and
        a sixth transistor of the second conductivity type, interposed between an inverted bit line and the second storage node, the sixth transistor including a gate connected to the word line;
    gates of the first and second transistors being connected to each other, and to the second storage node;
    gates of the third and fourth transistors being connected to each other, and to the first storage node;
    the first to sixth transistors being vertical nanowire field-effect transistors (VNW-FETs) located in a same position in a direction perpendicular to a substrate surface;
    top electrodes of the first, second, and fifth transistors being connected to the first storage node; and bottom electrodes of the third, fourth, and sixth transistors being connected to the second storage node.

2. The semiconductor integrated circuit device of claim 1, wherein
    the first, second, and fifth transistors are aligned in a first direction, and
    the third, fourth, and sixth transistors are aligned in the first direction.

3. The semiconductor integrated circuit device of claim 2, wherein
    the first and third transistors are aligned in a second direction perpendicular to the first direction,
    the second and fourth transistors are aligned in the second direction, and
    the fifth and sixth transistors are aligned in the second direction.

4. The semiconductor integrated circuit device of claim 1, wherein
    the SRAM cell further includes:
        a signal interconnect extending in the first direction and connected to the top electrodes of the first, second, and fifth transistors.

5. The semiconductor integrated circuit device of claim 1, wherein
    the SRAM cell further includes:

a first bottom region connected to the bottom electrodes of the third and sixth transistors;
a second bottom region connected to the bottom electrode of the fourth transistor; and
an interconnect between bottom regions, connecting the first and second bottom regions.

6. A semiconductor integrated circuit device comprising:
a static random-access memory (SRAM) cell including:
a first storage node;
a second storage node;
a first transistor of a first conductivity type, interposed between a higher-voltage power line and the first storage node;
a second transistor of a second conductivity type, interposed between a lower-voltage power line and the first storage node;
a third transistor of the first conductivity type, interposed between the higher-voltage power line and the second storage node;
a fourth transistor of the second conductivity type, interposed between the lower-voltage power line and the second storage node;
a fifth transistor of the second conductivity type, interposed between a first bit line and the first storage node, the fifth transistor including a gate connected to a first word line;
a sixth transistor of the second conductivity type, interposed between a first inverted bit line and the second storage node, the sixth transistor including a gate connected to the first word line;
a seventh transistor of the second conductivity type, interposed between a second bit line and the first storage node, the seventh transistor including a gate connected to a second word line; and
an eighth transistor of the second conductivity type, interposed between a second inverted bit line and the second storage node, the eighth transistor including a gate connected to the second word line;
gates of the first and second transistors being connected to each other, and to the second storage node;
gates of the third and fourth transistors being connected to each other, and to the first storage node;
the first to eighth transistors being vertical nanowire field-effect transistors (VNW-FETs) located in a same position in a direction perpendicular to a substrate surface;
top electrodes of the first, second, fifth, and seventh transistors being connected to the first storage node; and
bottom electrodes of the third, fourth, sixth, and eighth transistors being connected to the second storage node.

7. The semiconductor integrated circuit device of claim 6, wherein
the first, second, fifth, and seventh transistors are aligned in a first direction, and
the third, fourth, sixth, and eighth transistors are aligned in the first direction.

8. The semiconductor integrated circuit device of claim 7, wherein
the first and third transistors are aligned in a second direction perpendicular to the first direction,
the second and fourth transistors are aligned in the second direction, and
the fifth and sixth transistors are aligned in the second direction, and
the seventh and eighth transistors are aligned in the second direction.

9. The semiconductor integrated circuit device of claim 6, wherein
the SRAM cell further includes:
a signal interconnect extending in the first direction and connected to the top electrodes of the first, second, fifth, and seventh transistors.

10. The semiconductor integrated circuit device of claim 6, wherein
the SRAM cell further includes:
a first bottom region connected to the bottom electrodes of the third and sixth transistors;
a second bottom region connected to the bottom electrode of the fourth transistor; and
a third bottom region connected to the bottom electrode of the eighth transistor; and
a first interconnect between bottom regions, connecting the first and second bottom regions.
a second interconnect between bottom regions, connecting the second and third bottom regions.

* * * * *